(12) United States Patent
Rajashekhar et al.

(10) Patent No.: US 12,137,554 B2
(45) Date of Patent: Nov. 5, 2024

(54) THREE-DIMENSIONAL MEMORY DEVICE WITH WORD-LINE ETCH STOP LINERS AND METHOD OF MAKING THEREOF

(71) Applicant: SANDISK TECHNOLOGIES LLC, Addison, TX (US)

(72) Inventors: Adarsh Rajashekhar, Santa Clara, CA (US); Raghuveer S. Makala, Campbell, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 407 days.

(21) Appl. No.: 17/525,233

(22) Filed: Nov. 12, 2021

(65) Prior Publication Data
US 2023/0157013 A1 May 18, 2023

(51) Int. Cl.
*H10B 41/27* (2023.01)
*H01L 21/768* (2006.01)
*H10B 43/27* (2023.01)

(52) U.S. Cl.
CPC ....... *H10B 41/27* (2023.02); *H01L 21/76802* (2013.01); *H01L 21/76829* (2013.01); *H10B 43/27* (2023.02)

(58) Field of Classification Search
USPC ........................................................ 257/315
See application file for complete search history.

(56) References Cited

U.S. PATENT DOCUMENTS

| | | | |
|---|---|---|---|
| 5,915,167 A | 6/1999 | Leedy | |
| 9,716,105 B1 | 7/2017 | Tsutsumi | |
| 10,453,854 B2 | 10/2019 | Kanno et al. | |
| 10,461,163 B2 | 10/2019 | Kanakamedala et al. | |
| 10,608,010 B2 | 3/2020 | Terasawa et al. | |
| 2014/0197470 A1* | 7/2014 | Lee | H10B 43/10 257/314 |
| 2016/0358855 A1 | 12/2016 | Oh | |
| 2017/0117222 A1 | 4/2017 | Kim et al. | |
| 2018/0144977 A1 | 5/2018 | Yu et al. | |
| 2019/0148392 A1 | 5/2019 | Kanno et al. | |
| 2019/0148506 A1* | 5/2019 | Kanakamedala | H10B 43/50 257/315 |
| 2019/0280001 A1 | 9/2019 | Terasawa et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Meiya Li
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, memory stack structures vertically extending through the alternating stack, etch stop plates located in the staircase region, laterally and vertically spaced apart among one another, and overlying an end portion of a respective one of the electrically conductive layers, and contact via structures located in a staircase region, vertically extending through a respective one of the etch stop plates, and contacting a respective one of the electrically conductive layers.

6 Claims, 37 Drawing Sheets

(56) References Cited

U.S. PATENT DOCUMENTS

2020/0219764 A1* 7/2020 Lee .................. H01L 21/02381
2021/0305266 A1* 9/2021 Lee ....................... H10B 41/27

OTHER PUBLICATIONS

Padiyath, R. et al., "Reactive ion etching of monocrystalline, polycrystalline, and amorphous silicon carbide in $CF_4/O_2$ mixtures," Applied Physics Letters, vol. 58, No. 10, pp. 1053-1055, (1991); http://dx.doi.org/10.1063/1.104420.
https://www.thomasnet.com/articles/metals-metal-products/tungsten-vs-tungsten-carbide/, "Tungsten vs Tungsten Carbide—What's the Difference?" viewed on Nov. 12, 2021.
Yokoyama et al., "Low-Temperature Selective Deposition of Silicon on Silicon Nitride by Time-Modulated Disilane Flow and Formation of Silicon Narrow Wires," Applied Physics Letters, vol. 79, No. 4, pp. 494-496, (2001); https://doi.org/10.1063/1.1387260.
U.S. Appl. No. 17/355,883, filed Jun. 23, 2021, SanDisk Technologies LLC.
Notification of Transmittal of The International Search Report and Written Opinion of the International Searching Authority for International Patent Application No. PCT/US2022/029342, mailed Oct. 17, 2022, 9 pages.

* cited by examiner

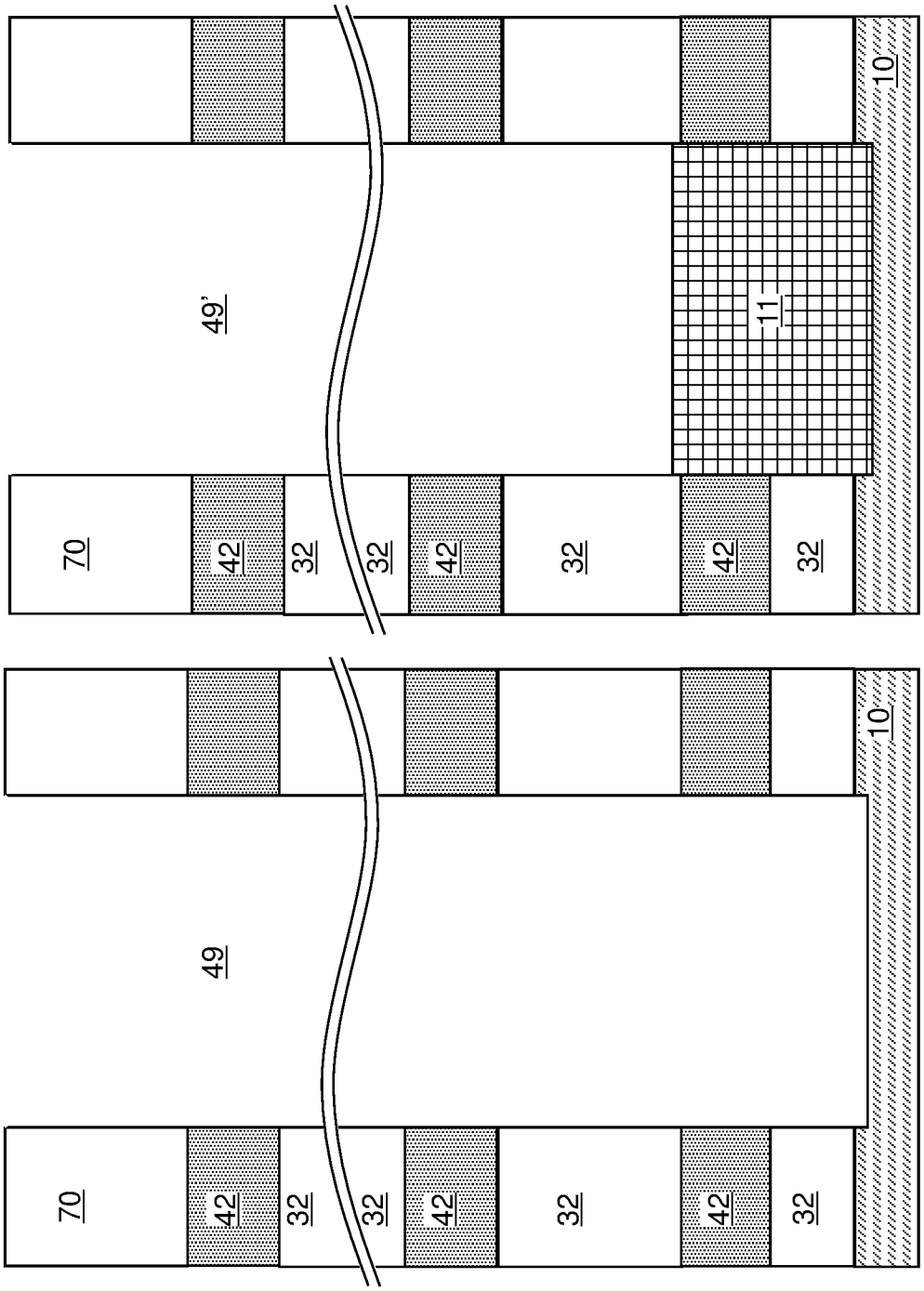

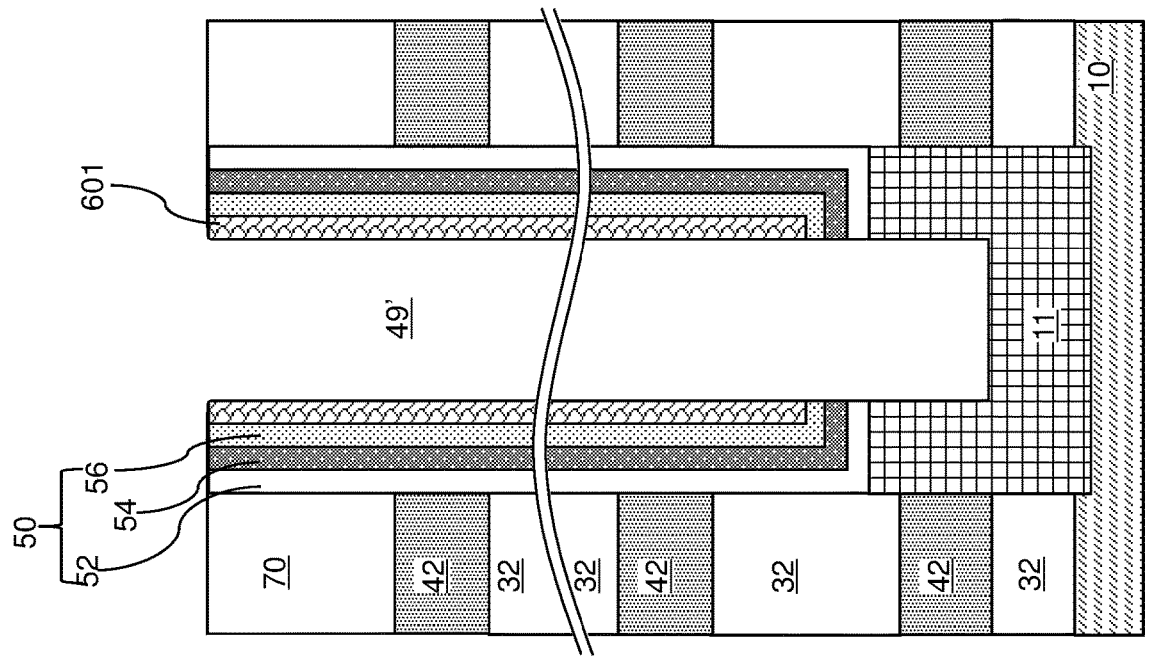
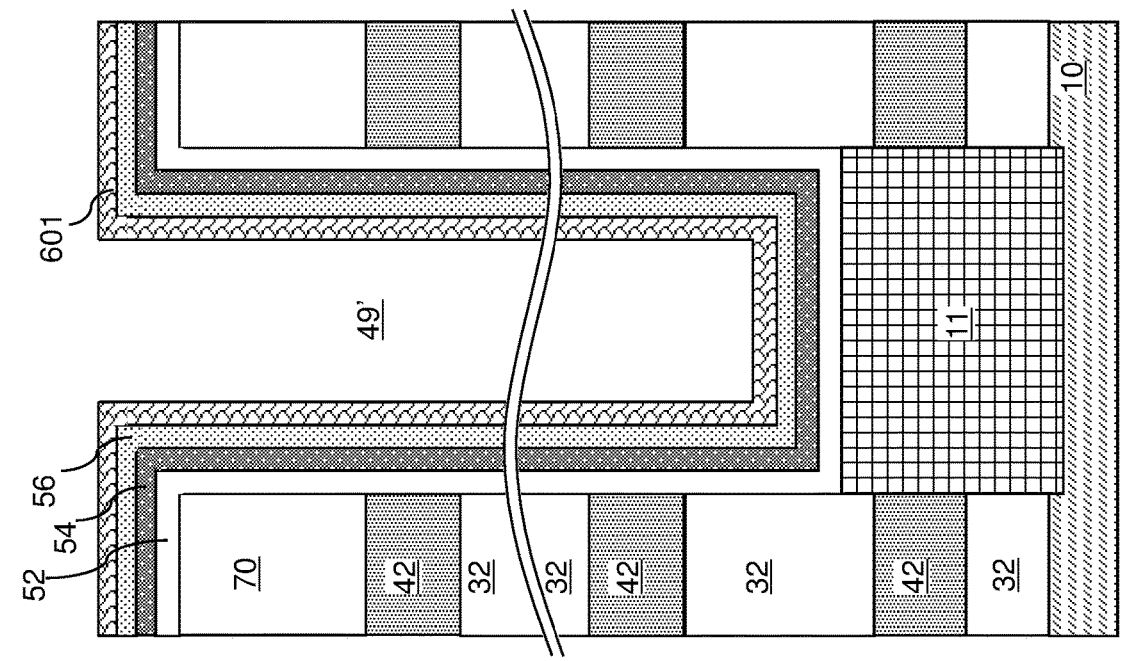

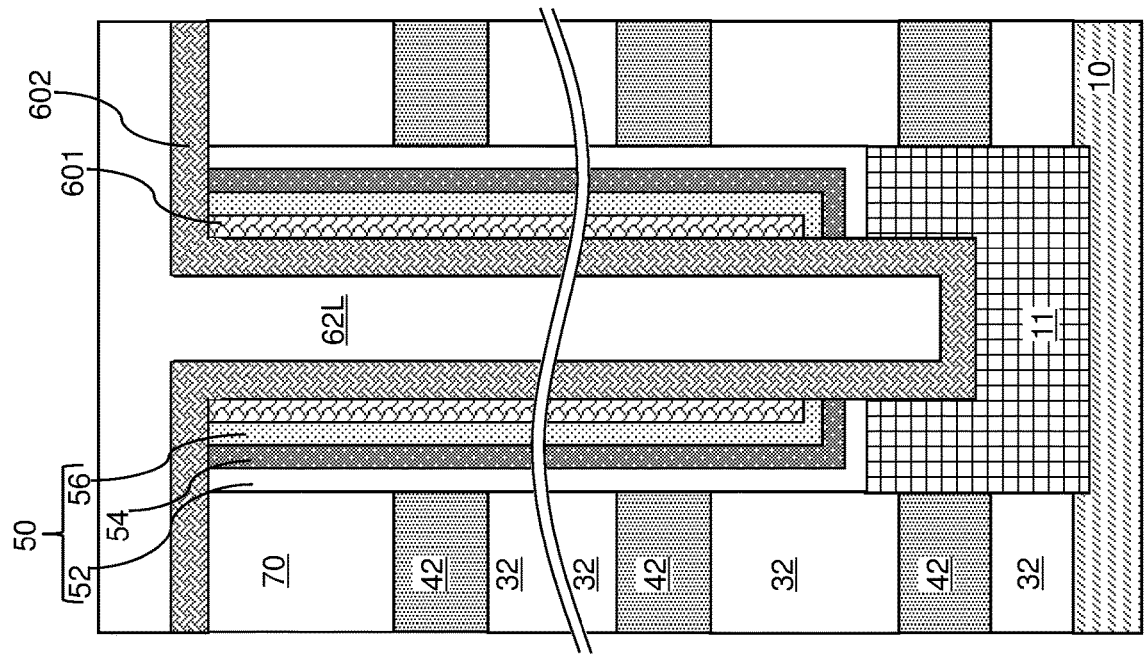
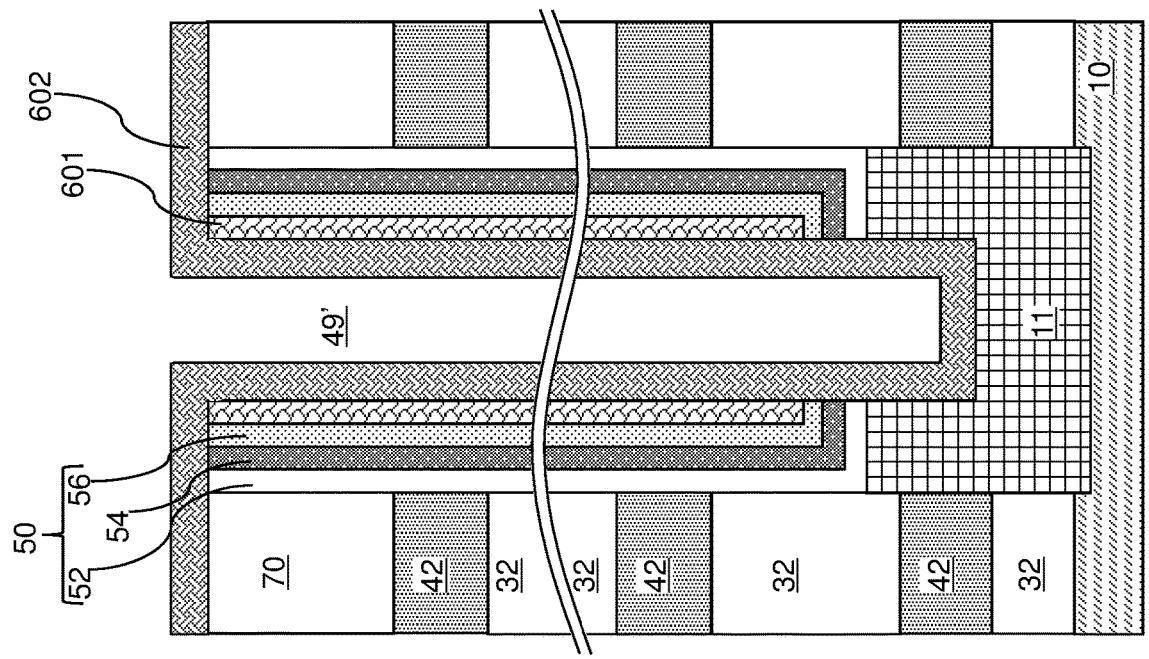

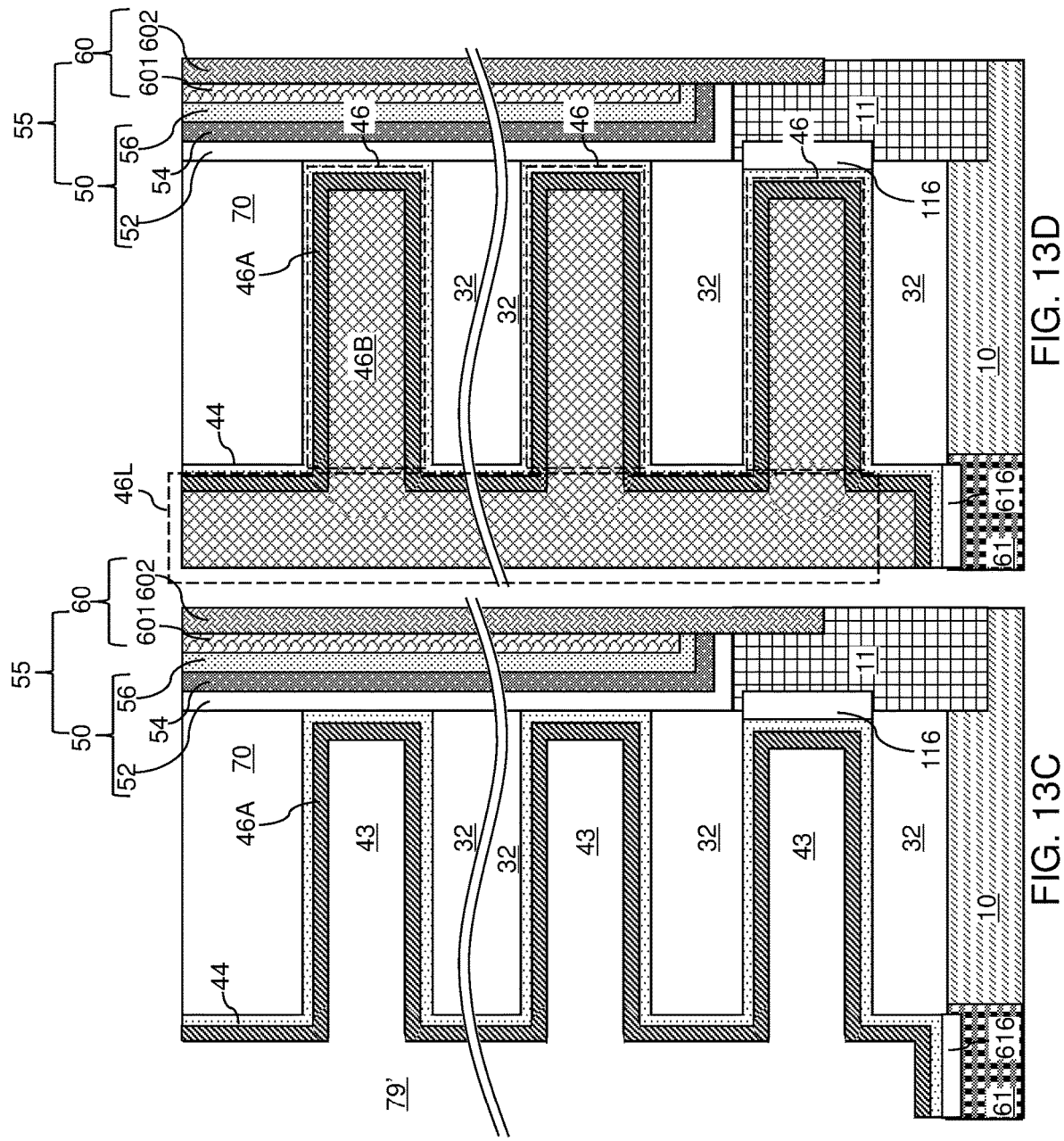

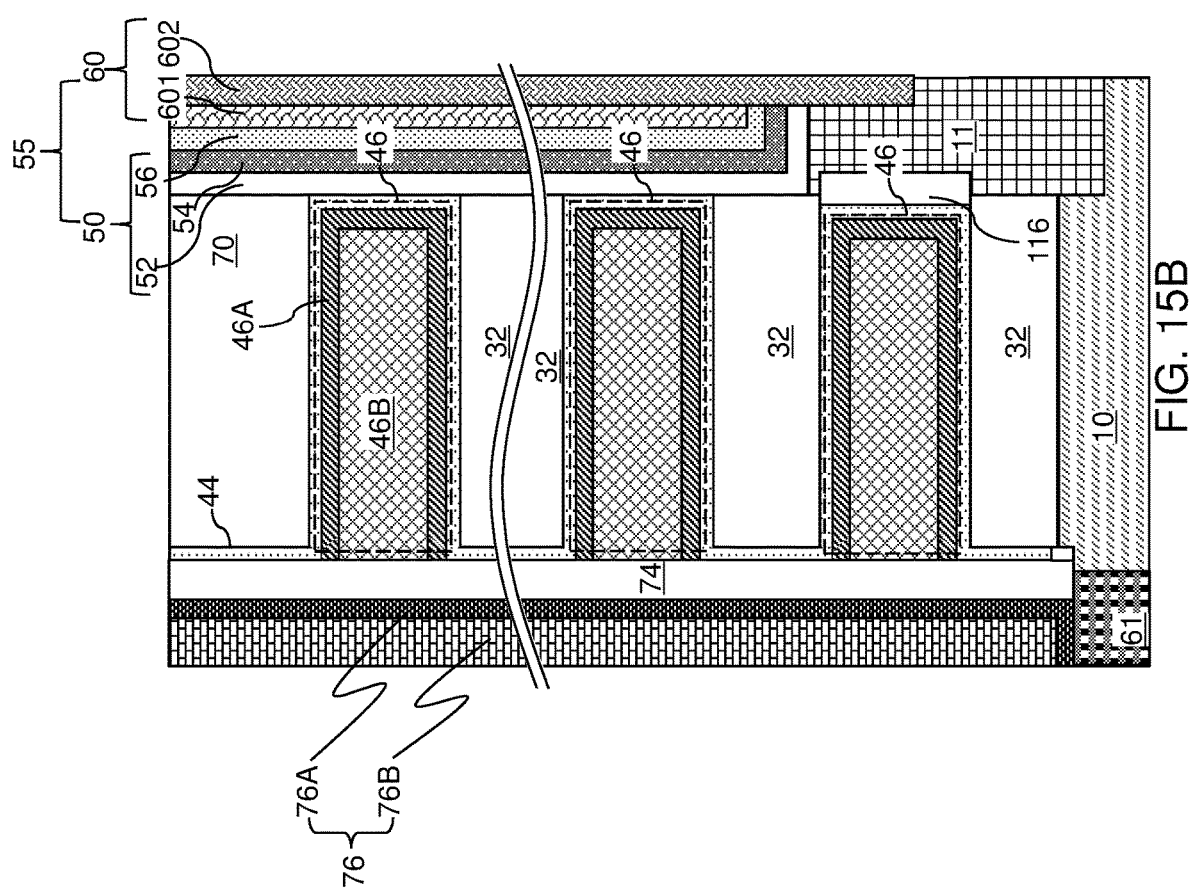

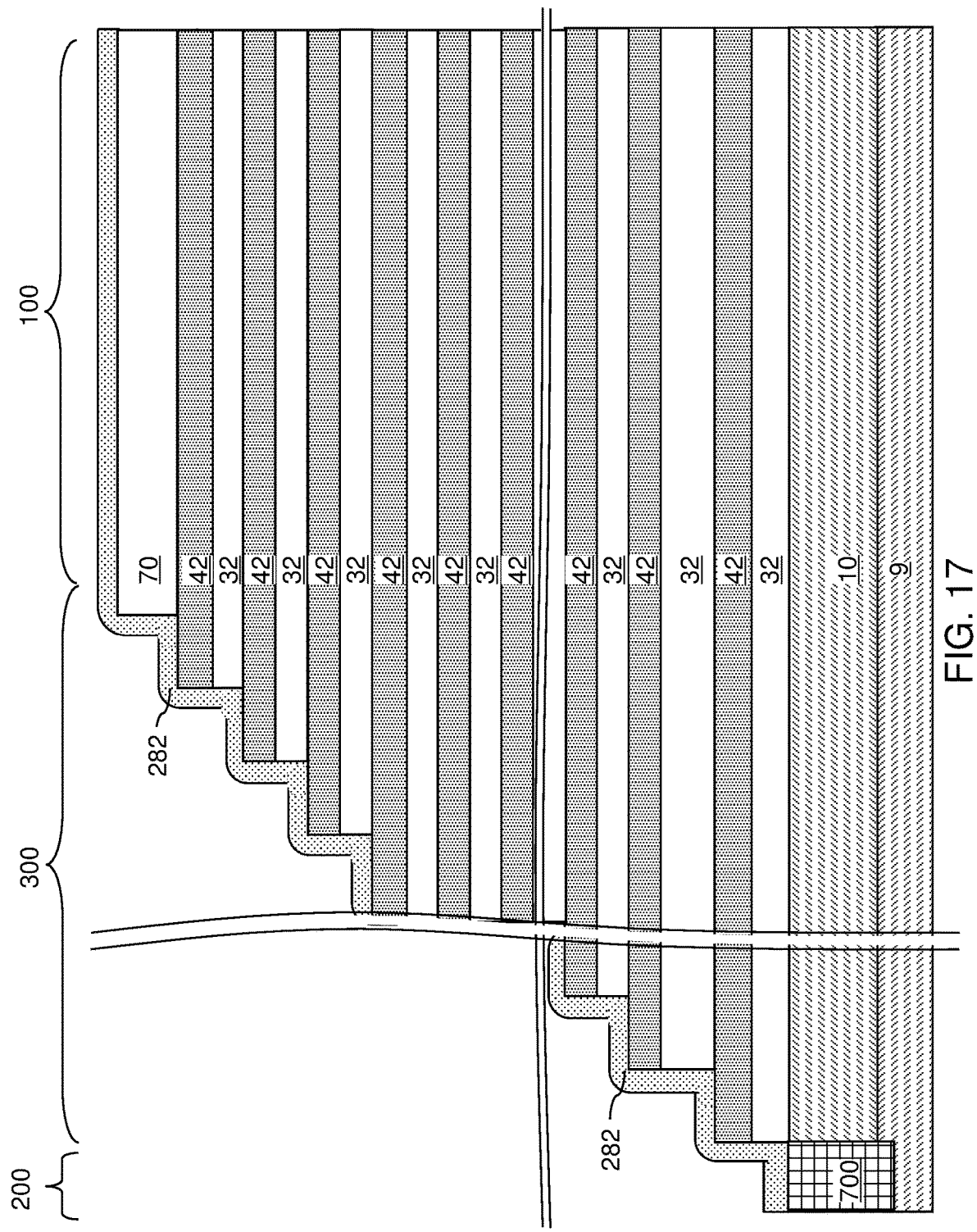

THREE-DIMENSIONAL MEMORY DEVICE WITH WORD-LINE ETCH STOP LINERS AND METHOD OF MAKING THEREOF

FIELD

The present disclosure relates generally to the field of semiconductor devices, and particular to a three-dimensional memory device employing word-line etch stop liners and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the alternating stack comprises a staircase region in which lateral extents of the electrically conductive layers decrease with a vertical distance from the substrate; memory stack structures vertically extending through the alternating stack, wherein each of the memory stack structures comprises a vertical semiconductor channel and a vertical stack of memory elements; etch stop plates located in the staircase region, and overlying an end portion of a respective one of the electrically conductive layers, wherein the etch stop plates comprise the material selected from tungsten nitride, tungsten carbide, tungsten carbonitride, aluminum oxide, or silicon carbide; and contact via structures located in the staircase region, vertically extending through a respective one of the etch stop plates, and contacting a respective one of the electrically conductive layers.

According to another aspect of the present disclosure, a method of forming a semiconductor structure comprises forming an alternating stack of insulating layers and sacrificial material layers over a substrate; forming stepped surfaces in a staircase region by patterning the alternating stack, wherein the alternating stack has variable lateral extents that decrease with a vertical distance from the substrate in the staircase region; forming semiconductor material plates over physically exposed horizontal surfaces of the sacrificial material layers in the staircase region employing a selective deposition process in which a semiconductor material selectively grows from the physically exposed horizontal surfaces of the sacrificial material layers; converting the semiconductor material plates into etch stop plates having a different material composition than the semiconductor material plates; forming memory stack structures through the alternating stack, wherein each of the memory stack structures comprises a vertical semiconductor channel and a vertical stack of memory elements; replacing at least the sacrificial material layers with electrically conductive layers; and forming contact via structures through a respective one of the etch stop plates and on a respective one of the electrically conductive layers.

According to another aspect of the present disclosure, a method of forming a semiconductor structure comprises forming an alternating stack of insulating layers and sacrificial material layers over a substrate; forming stepped surfaces in a staircase region by patterning the alternating stack; forming an etch stop layer that continuously extends over the stepped surfaces from a bottommost layer within the alternating stack to a topmost layer within the alternating stack; forming a retro-stepped dielectric material portion over the etch stop layer; forming memory stack structures through the alternating stack, wherein each of the memory stack structures comprises a vertical semiconductor channel and a vertical stack of memory elements; replacing at least the sacrificial material layers with electrically conductive layers; forming via cavities through the retro-stepped dielectric material portion, wherein a respective portion of the etch stop layer is physically exposed at a bottom of each of the via cavities; implanting ions through the via cavities into portions of the etch stop layer that underlie the via cavities such that the implanted portions of the etch stop layer become amorphous; removing the amorphous implanted portions of the etch stop layer; and forming contact via structures in the via cavities on a respective one of the electrically conductive layers.

6B is a schematic vertical cross-sectional view of the first exemplary structure after conversion of the semiconductor material plates into metal plates according to the first embodiment of the present disclosure.

Figure 7:
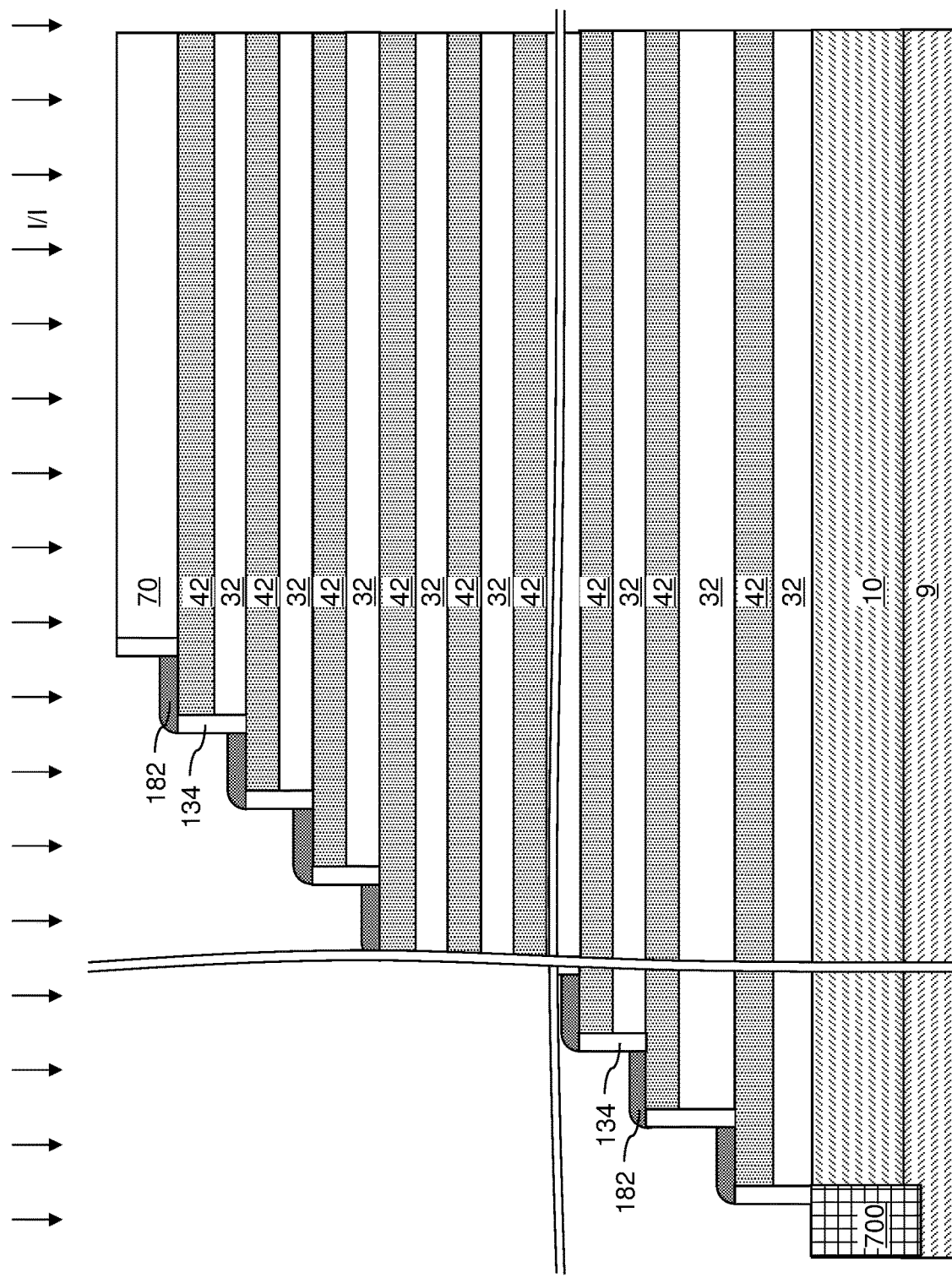

FIG. 7 is a schematic vertical cross-sectional view of the first exemplary structure after conversion of the metal plates into etch stop plates according to the first embodiment of the present disclosure.

Figure 8A:
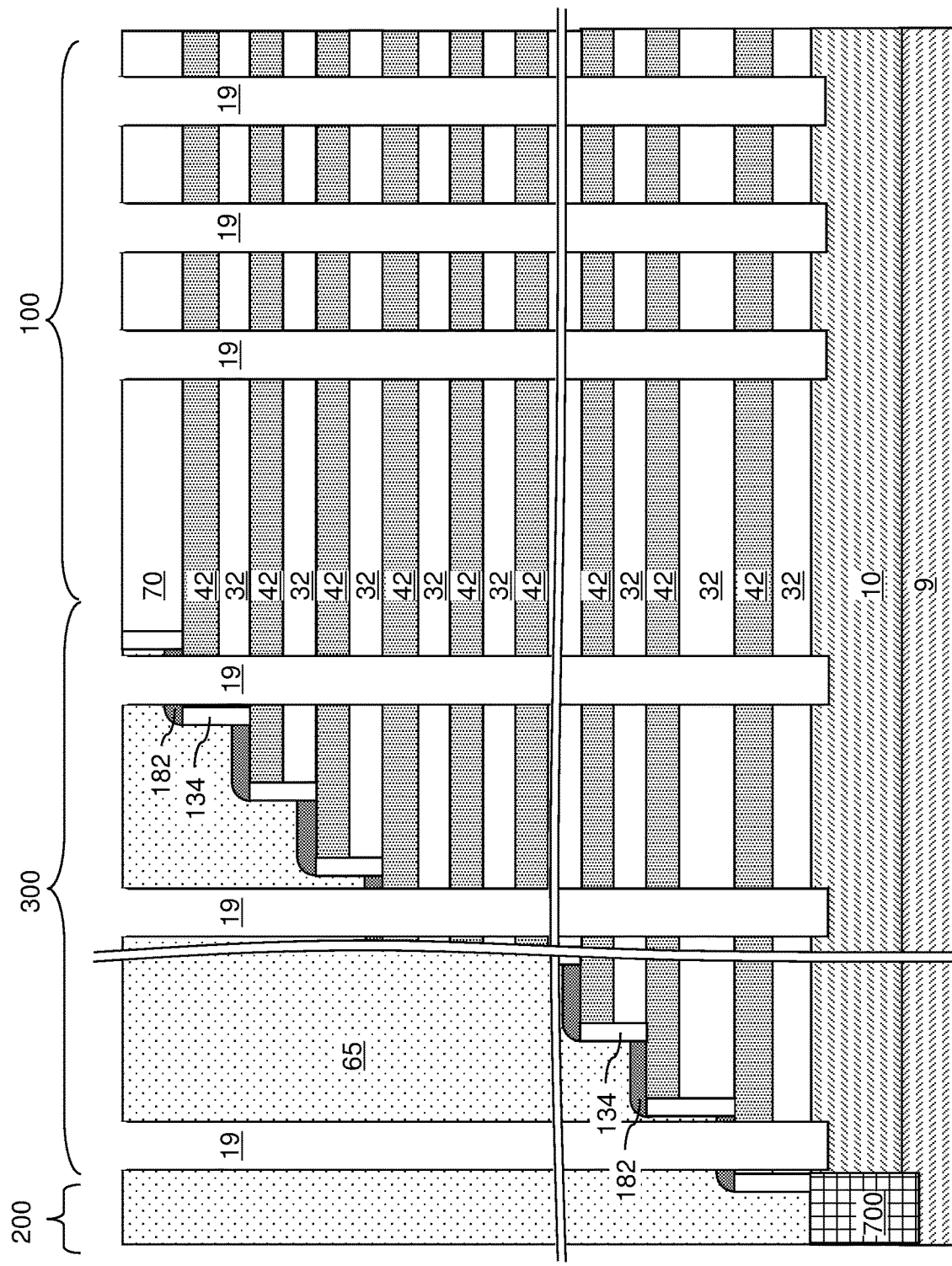

FIG. 8A is a schematic vertical cross-sectional view of the first exemplary structure after formation of a retro-stepped dielectric material portion and formation of memory openings and support openings according to the first embodiment of the present disclosure.

Figure 8B:
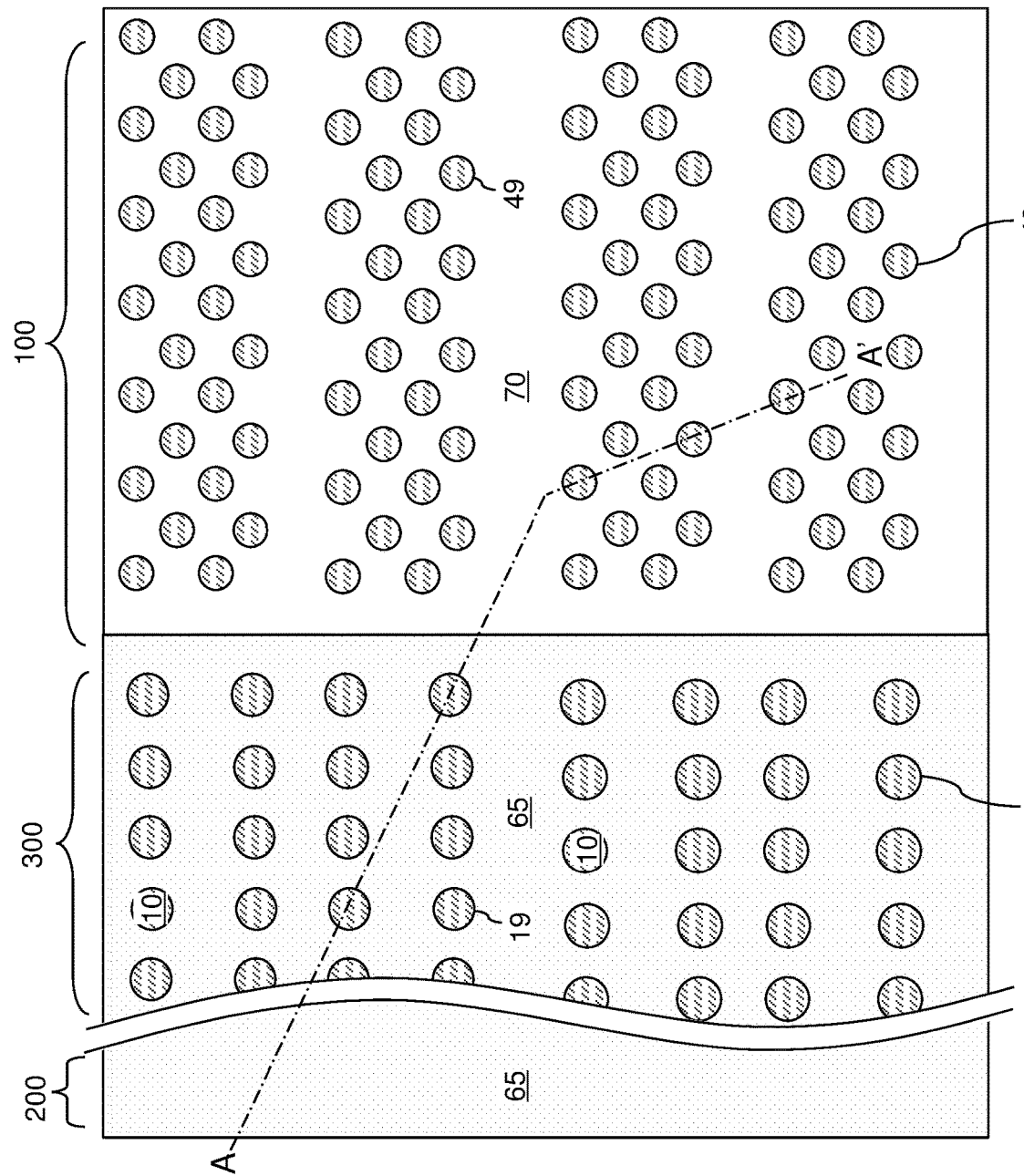

FIG. 8B is a top-down view of the first exemplary structure of FIG. 8A. The vertical plane A-A' is the plane of the cross-section for FIG. 8A.

FIGS. 9A-9H are sequential schematic vertical cross-sectional views of a memory opening within the first exemplary structure up to the processing step of deposition of a second semiconductor channel layer according to the first embodiment of the present disclosure.

Figure 10:
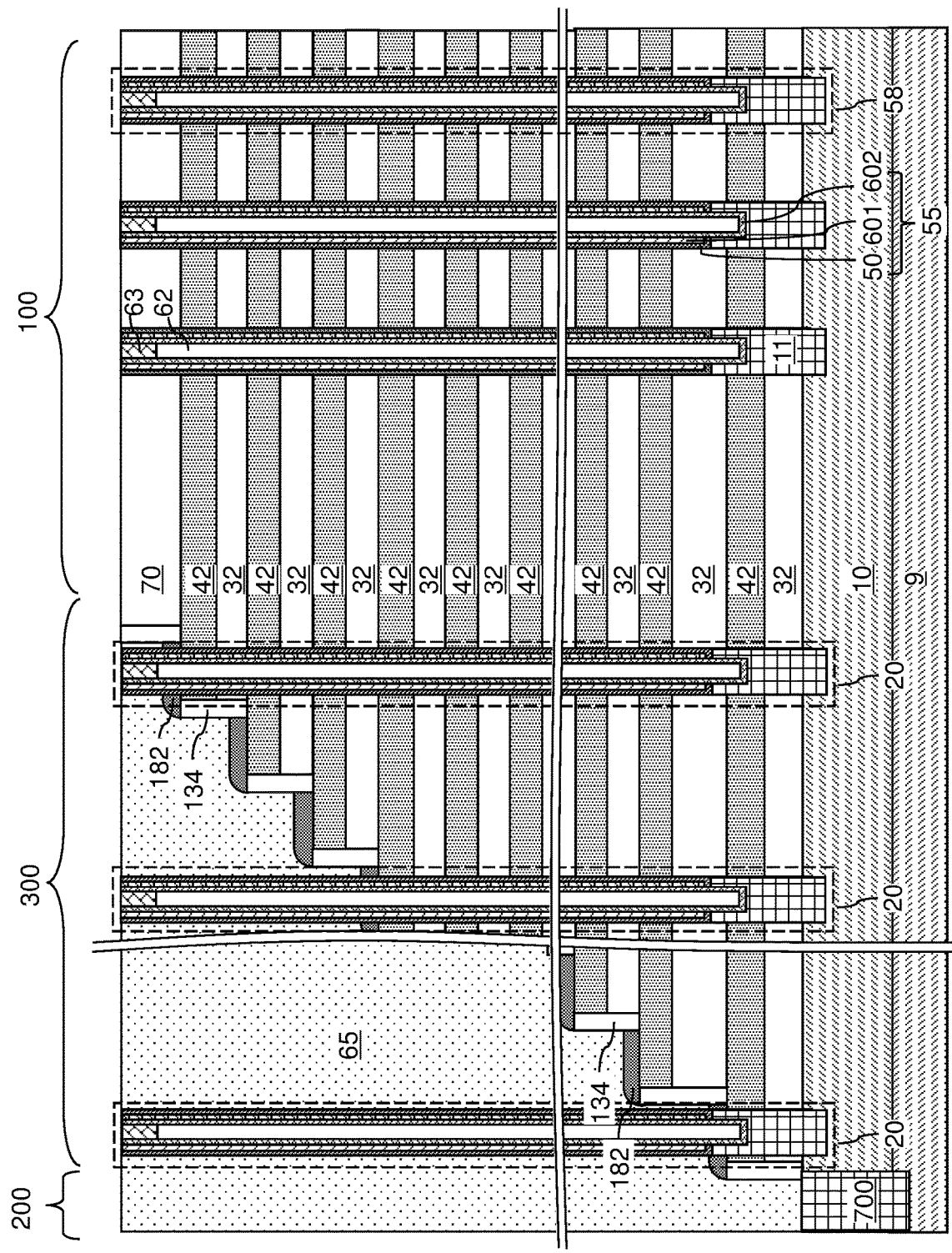

FIG. 10 is a schematic vertical cross-sectional view of the first exemplary structure after formation of memory stack structures and support pillar structures according to the first embodiment of the present disclosure.

Figure 11A:
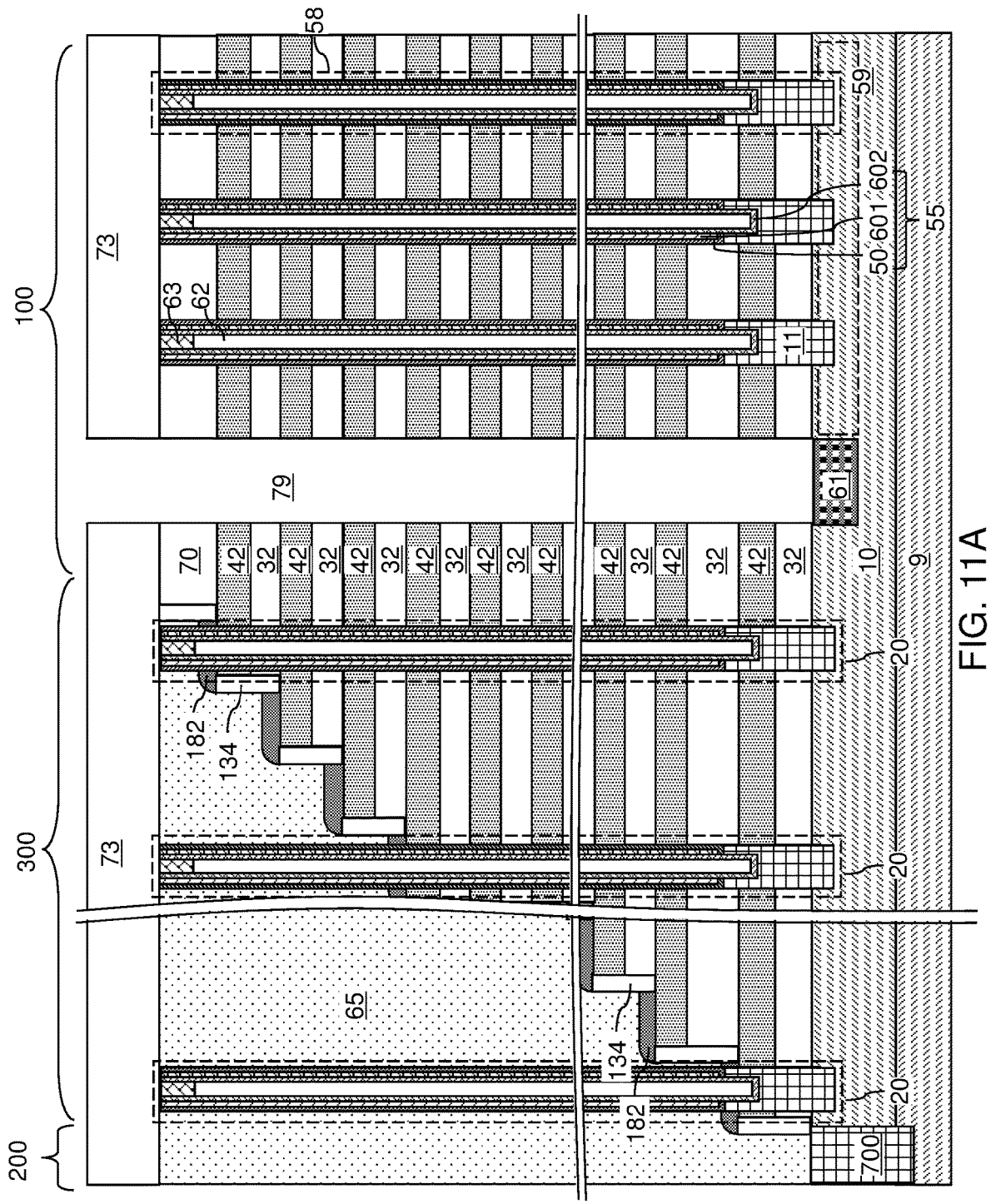

FIG. 11A is a schematic vertical cross-sectional view of the first exemplary structure after formation of backside trenches according to the first embodiment of the present disclosure.

Figure 11B:
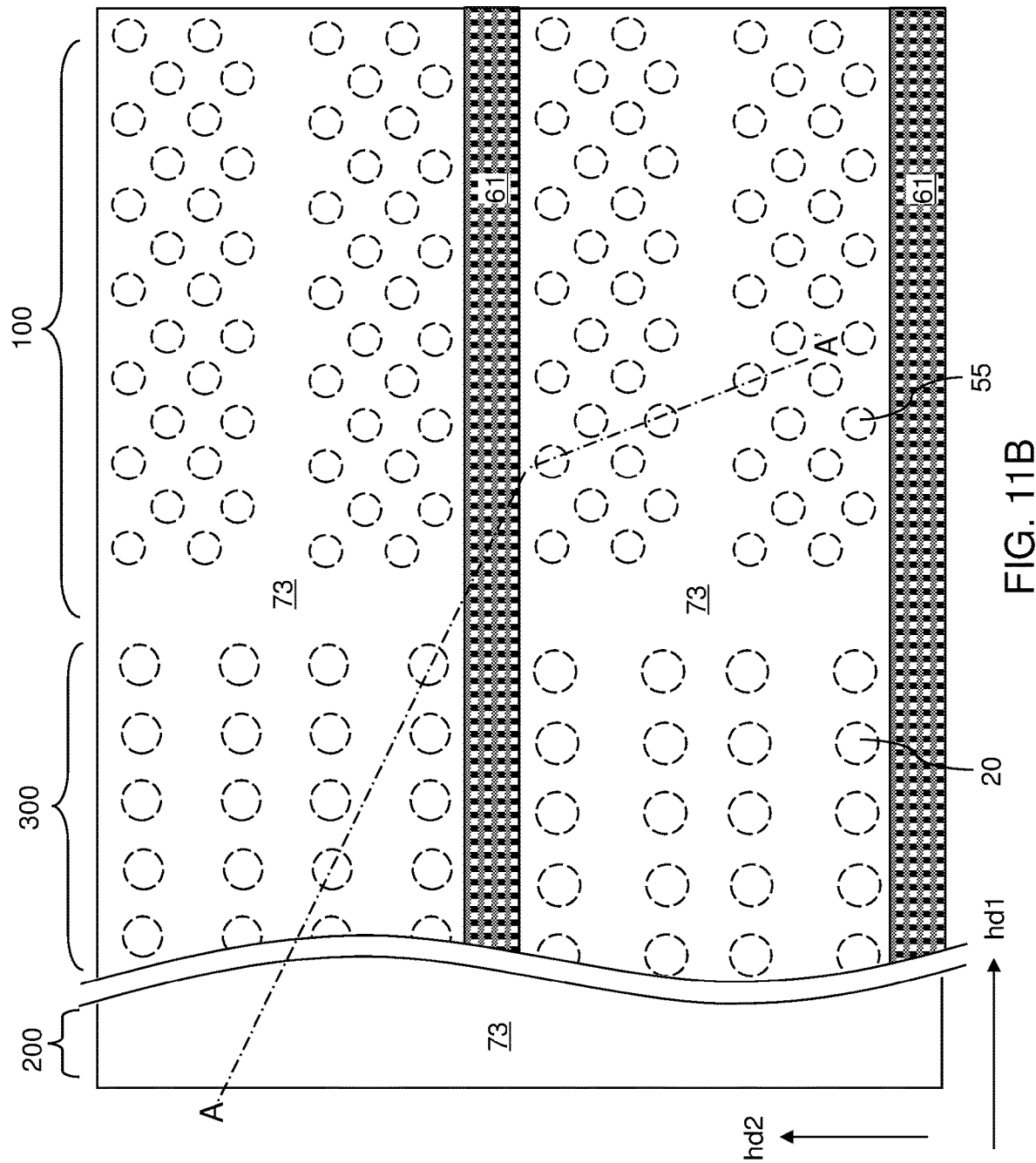

FIG. 11B is a top-down view of the first exemplary structure of FIG. 11A. The vertical plane A-A' is the plane of the schematic vertical cross-sectional view of FIG. 11A.

Figure 12:
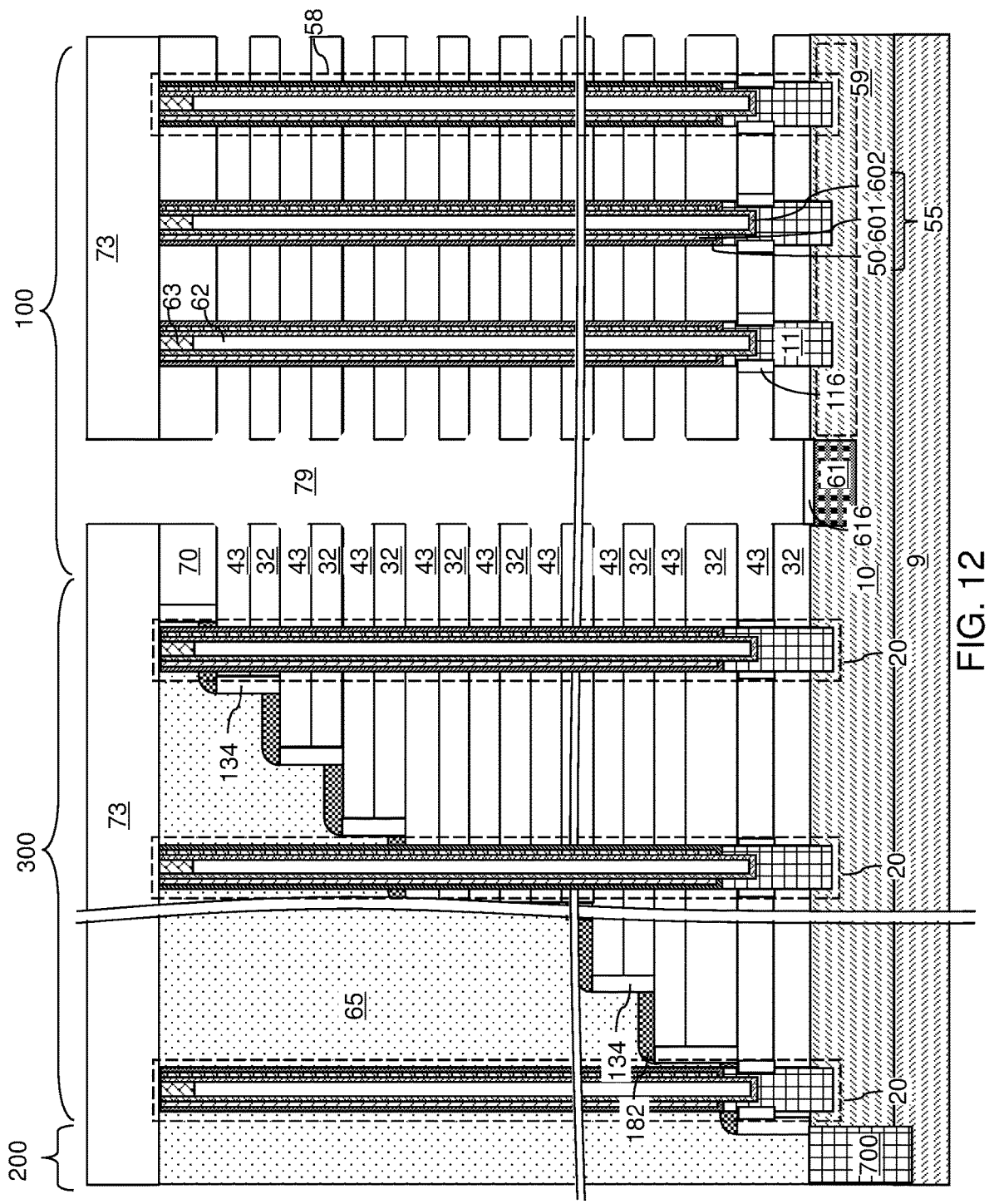

FIG. 12 is a schematic vertical cross-sectional view of the first exemplary structure after formation of backside recesses according to the first embodiment of the present disclosure.

FIGS. 13A-13D are sequential vertical cross-sectional views of a region of the first exemplary structure during formation of electrically conductive layers according to the first embodiment of the present disclosure.

Figures 13A, 13B:
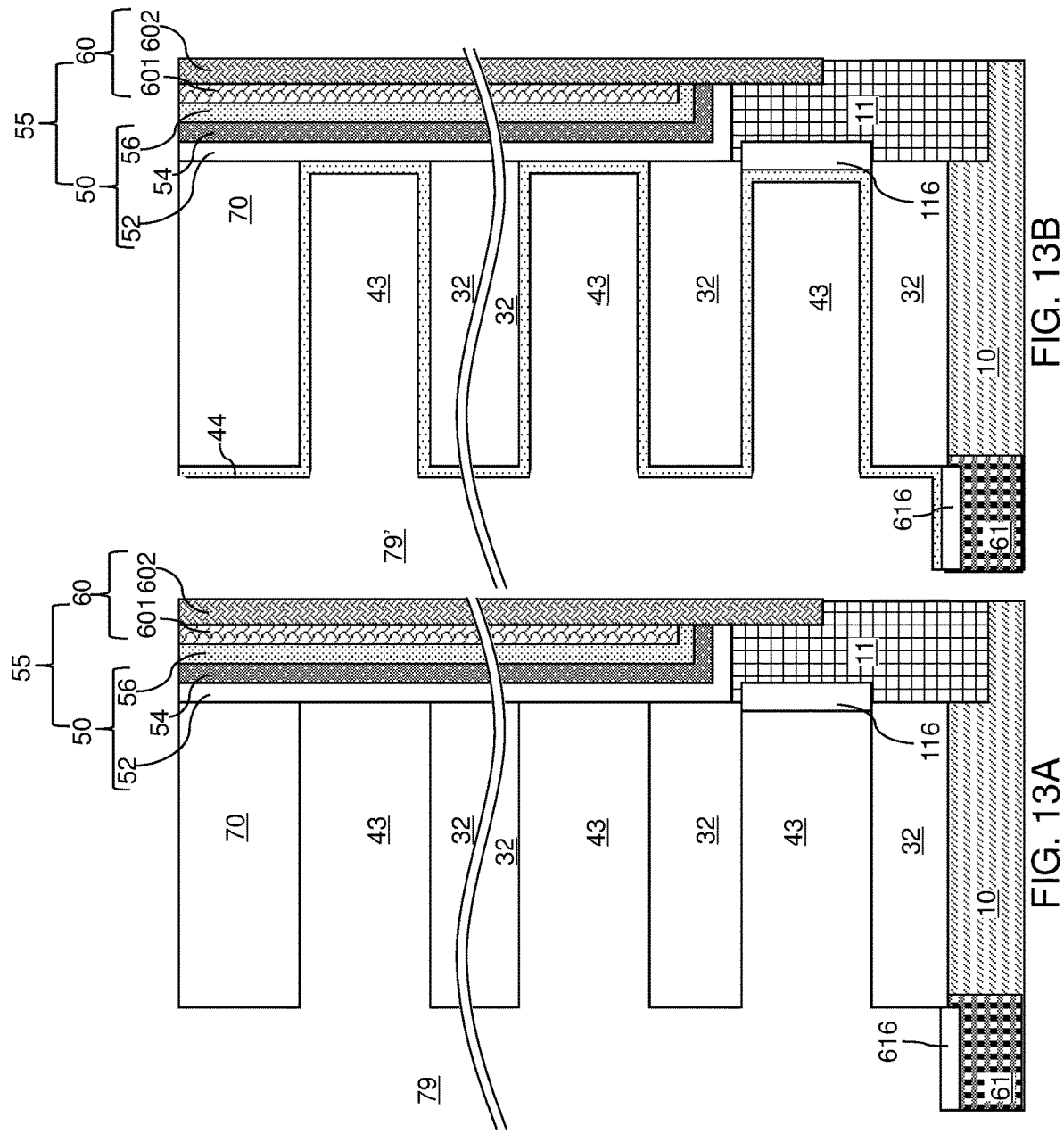
Figure 14A:
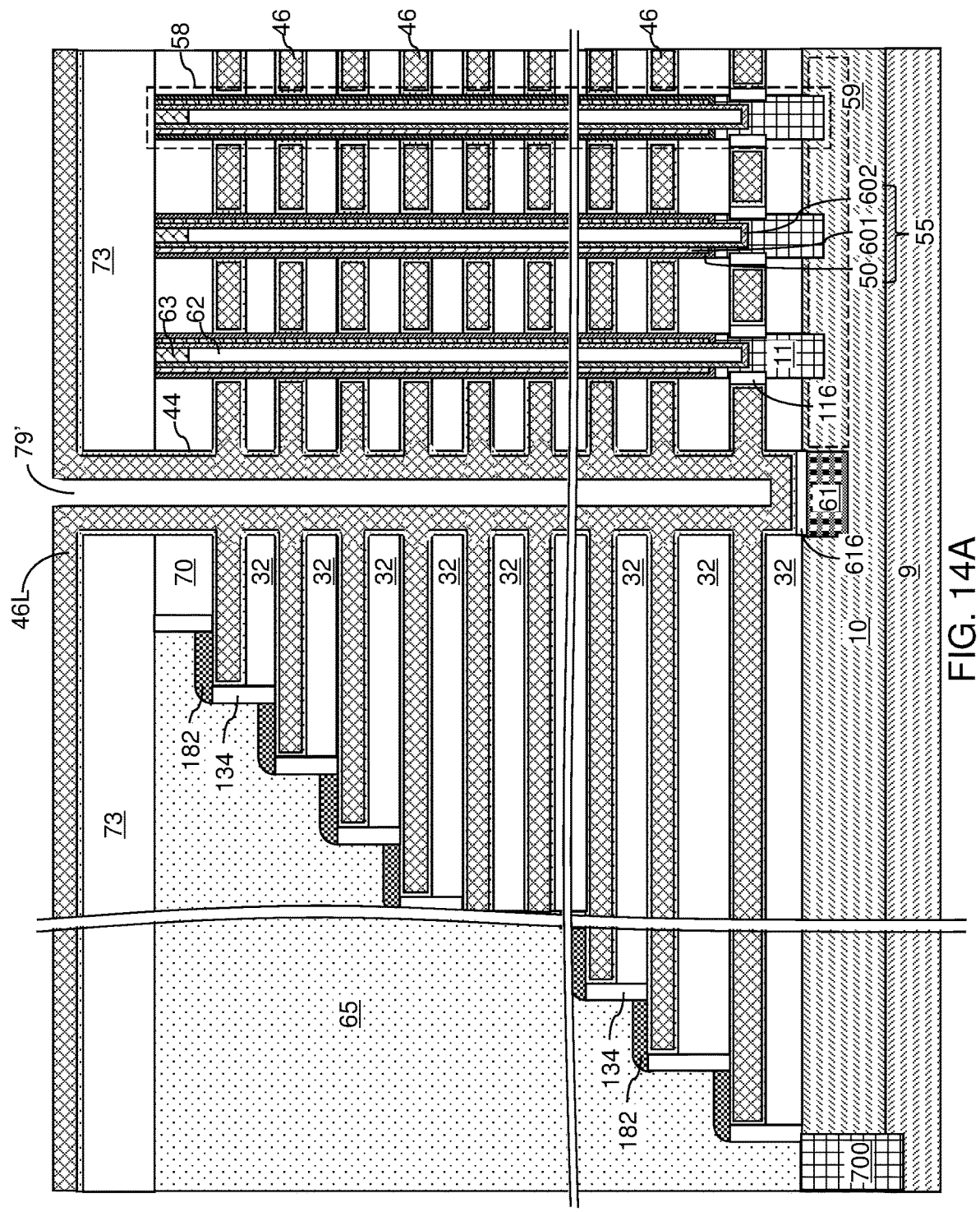

FIG. 14A is a schematic vertical cross-sectional view of the first exemplary structure at the processing step of FIG. 13D.

Figure 14B:
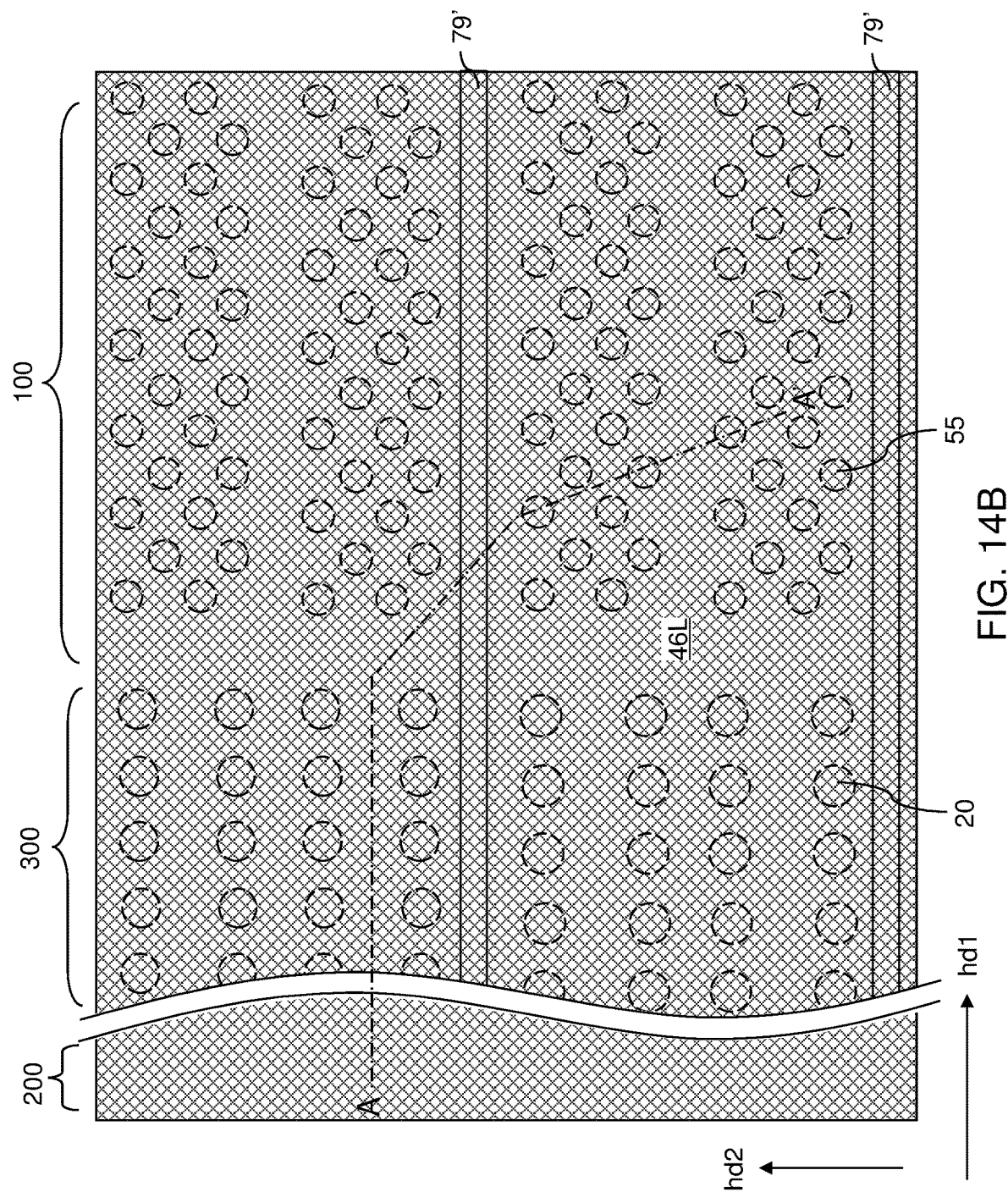

FIG. 14B is a top-down view of the first exemplary structure of FIG. 14A. The vertical plane A-A' is the plane of the schematic vertical cross-sectional view of FIG. 14A.

Figure 15A:
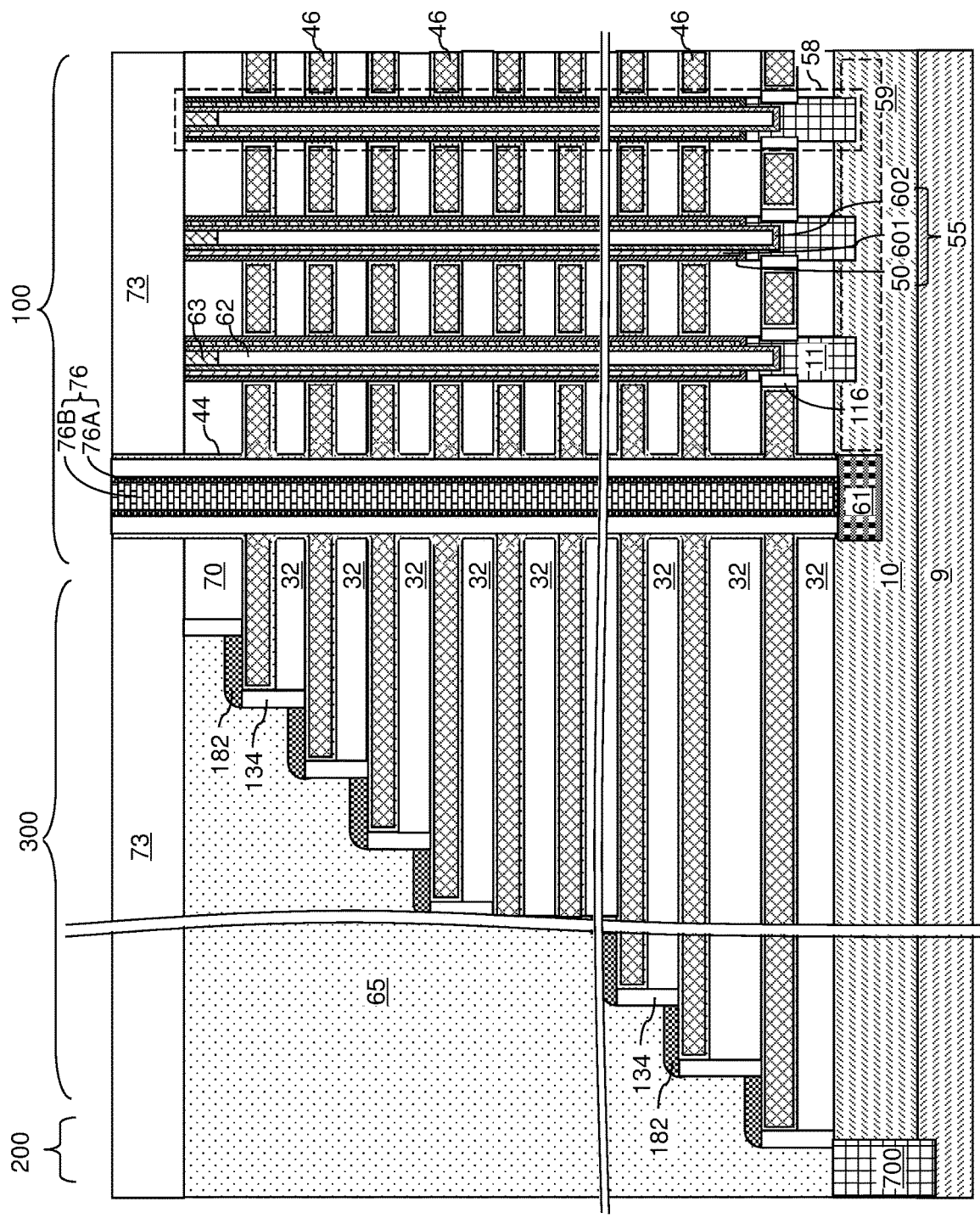

FIG. 15A is a schematic vertical cross-sectional view of the first exemplary structure after removal of a deposited conductive material from within the backside trenches and formation of an insulating spacer and a backside contact structure in each backside trench according to the first embodiment of the present disclosure.

FIG. 15B is a magnified view of a region of the first exemplary structure of FIG. 15A.

Figure 16A:
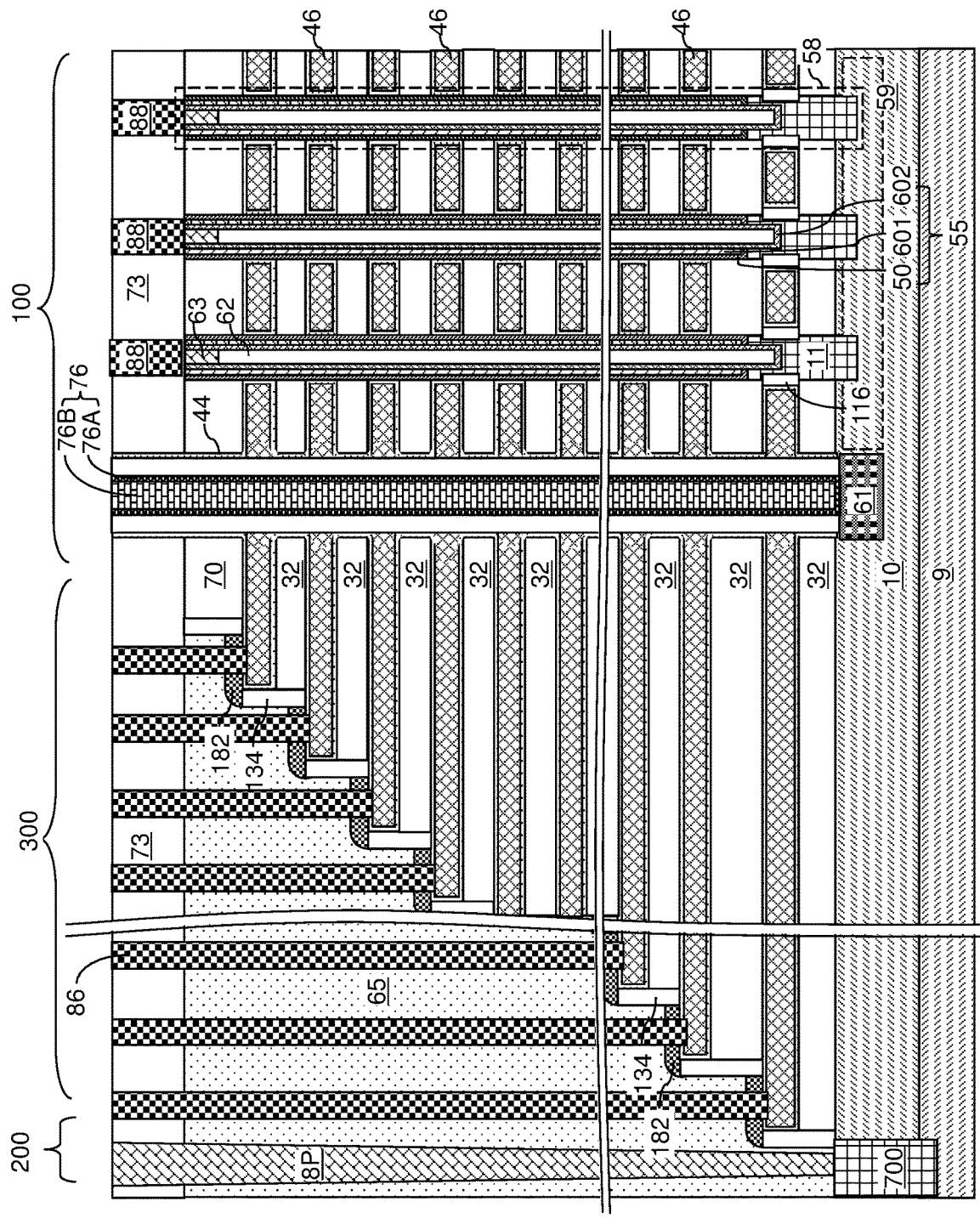

FIG. 16A is a schematic vertical cross-sectional view of the first exemplary structure after formation of additional contact via structures according to the first embodiment of the present disclosure.

Figure 16B:
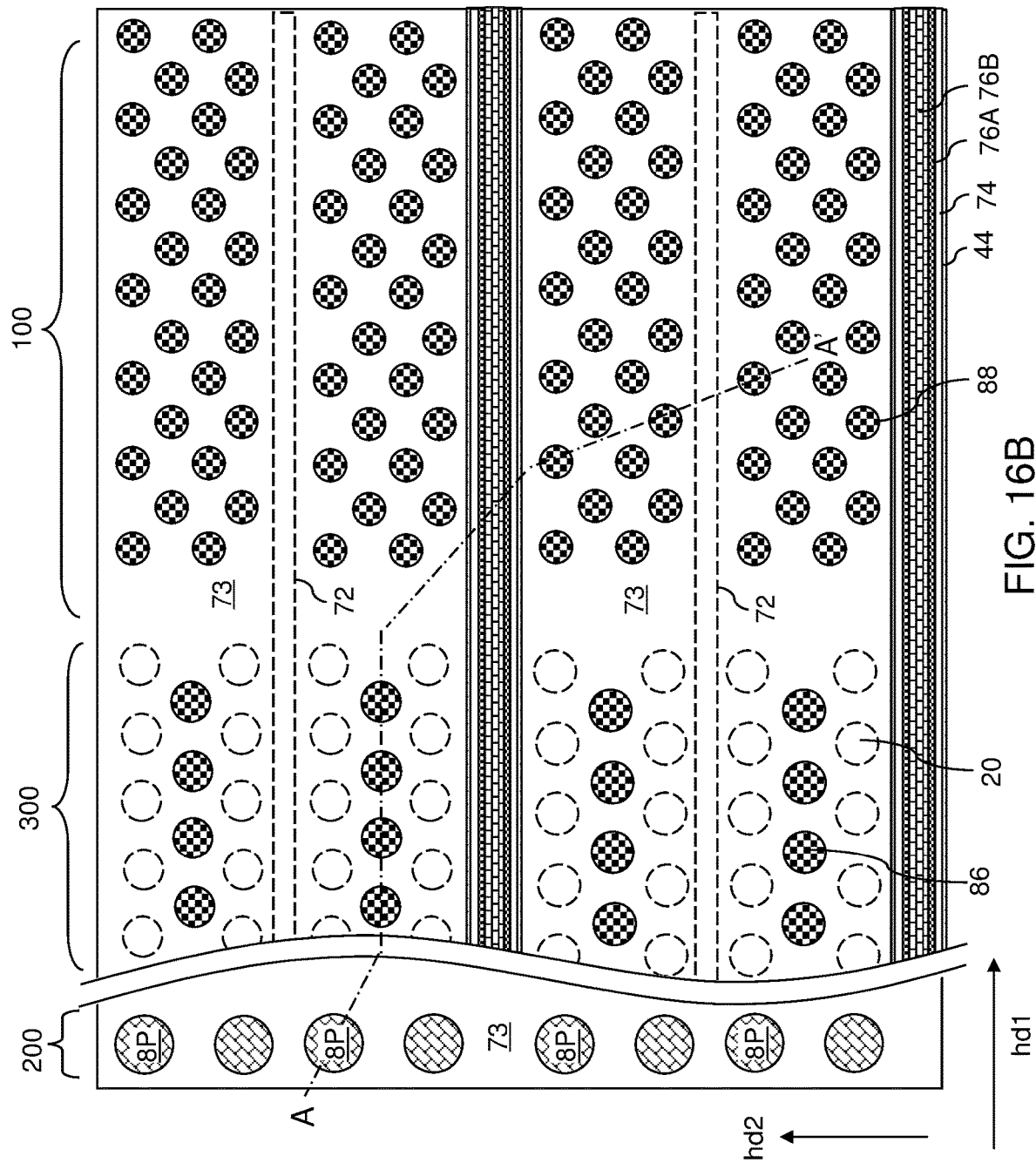

FIG. 16B is a top-down view of the first exemplary structure of FIG. 16A. The vertical plane A-A' is the plane of the schematic vertical cross-sectional view of FIG. 16A.

FIG. 17 is a schematic vertical cross-sectional view of a second exemplary structure after formation of an alternating stack of insulating layers and sacrificial material layers, stepped surfaces, and an etch stop layer according to a second embodiment of the present disclosure.

Figure 18:
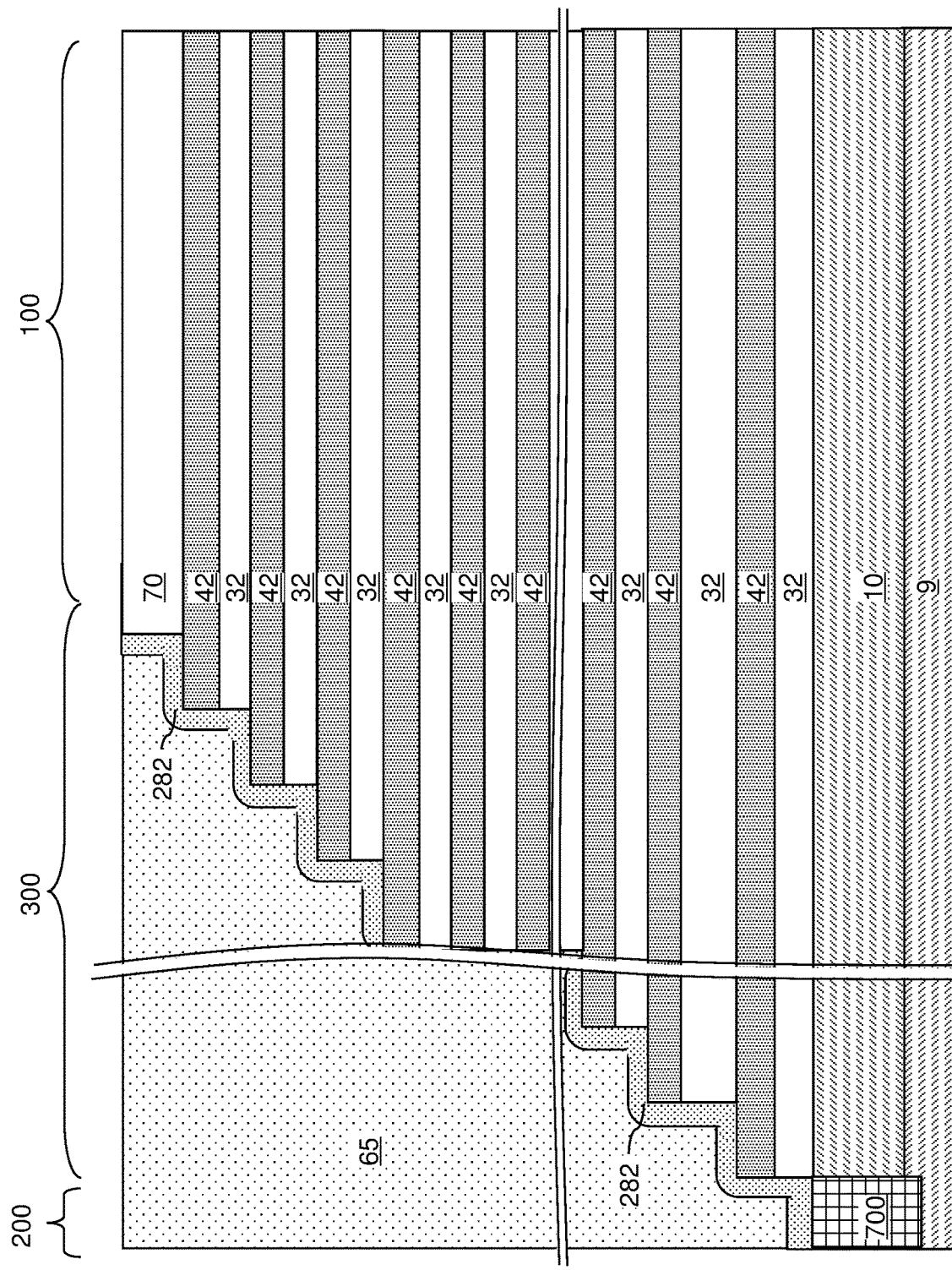

FIG. 18 is a schematic vertical cross-sectional view of a second exemplary structure after formation of a retro-stepped dielectric material portion according to the second embodiment of the present disclosure.

Figure 19:
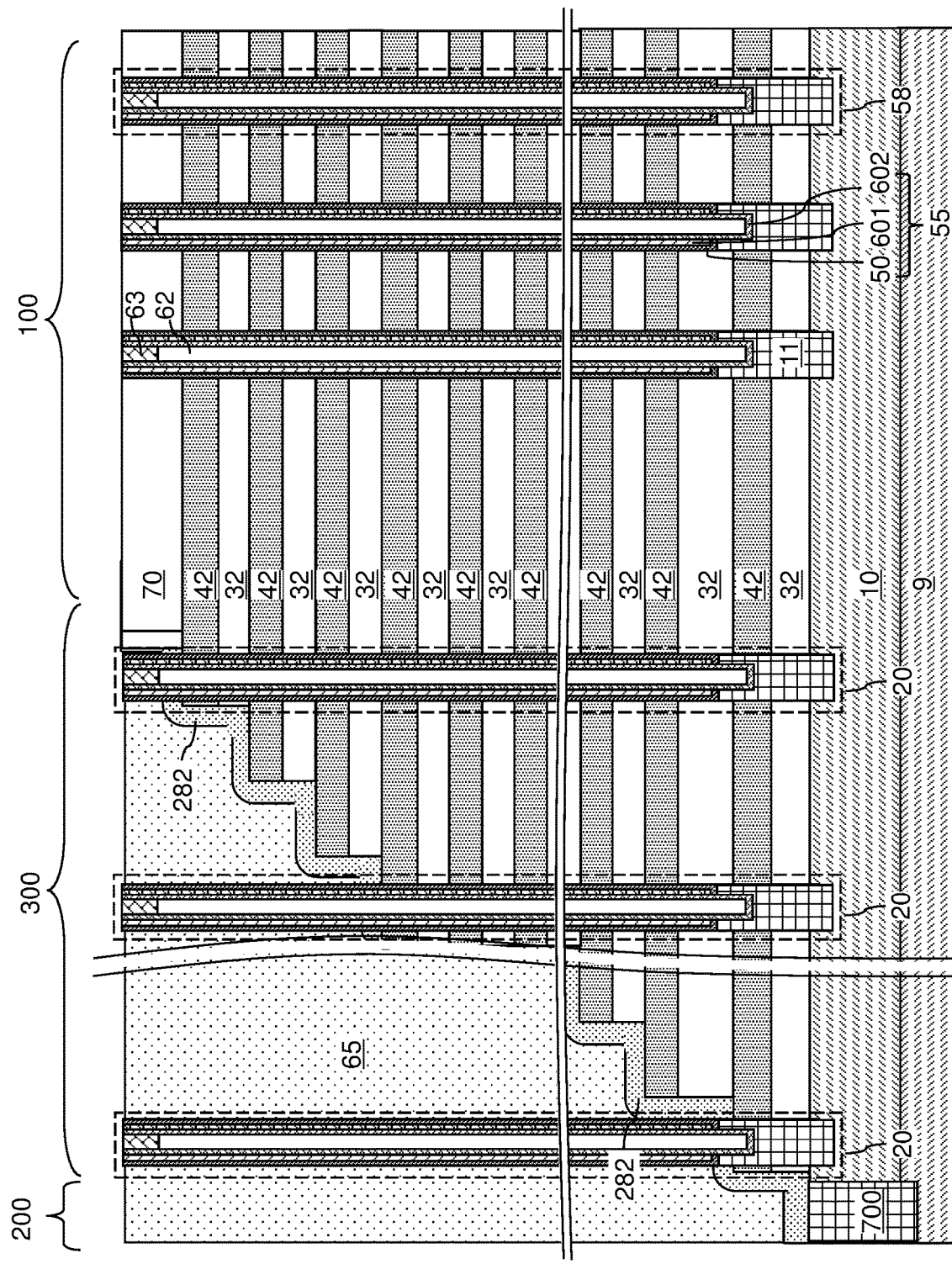

FIG. 19 is a schematic vertical cross-sectional view of the second exemplary structure after formation of memory stack structures and support pillar structures according to the second embodiment of the present disclosure.

Figure 20:
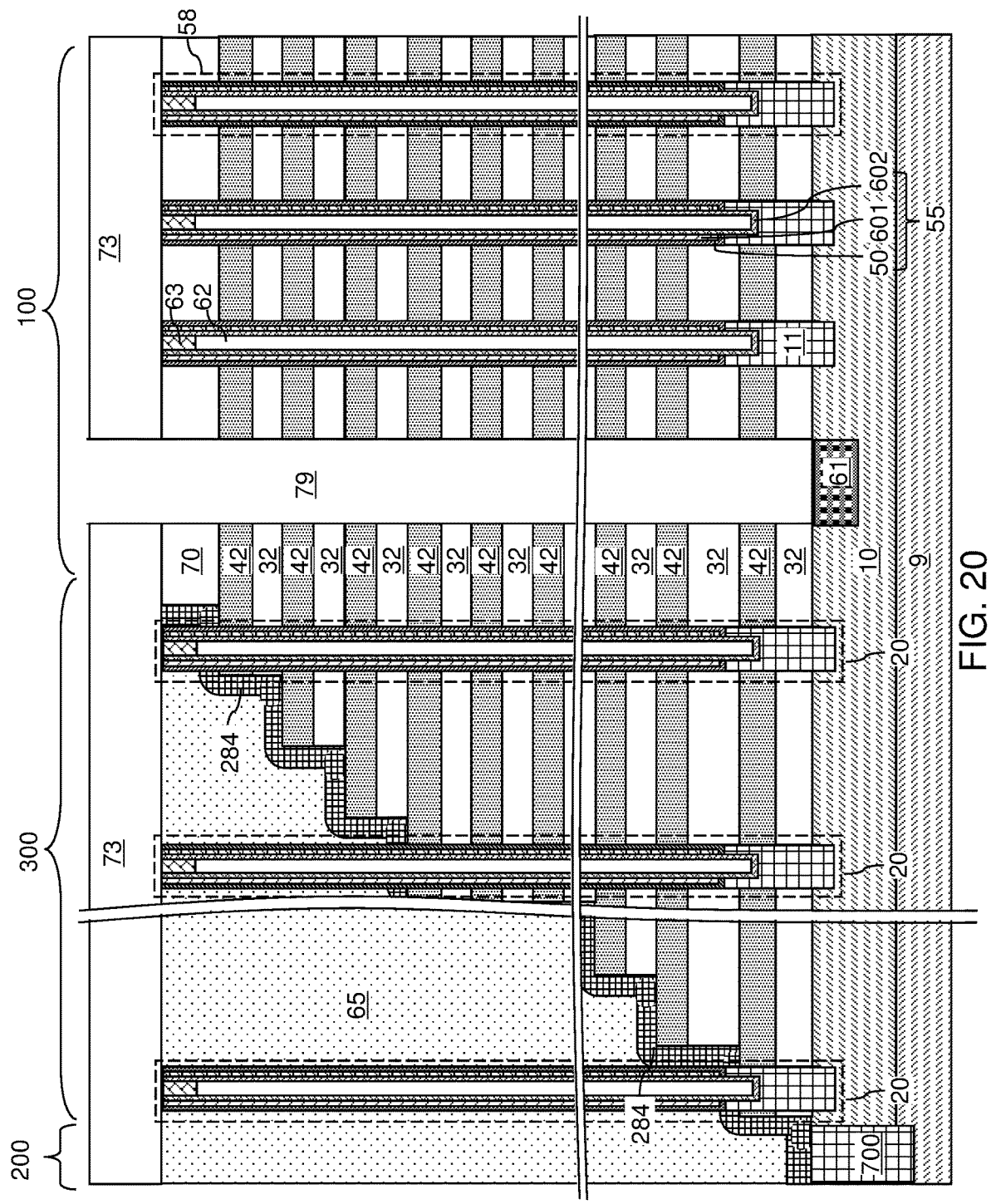

FIG. 20 is a schematic vertical cross-sectional view of the second exemplary structure after formation of backside trenches and source regions and after an anneal process that crystallizes an amorphous material of the etch stop layer into a polycrystalline material according to the second embodiment of the present disclosure.

Figure 21:
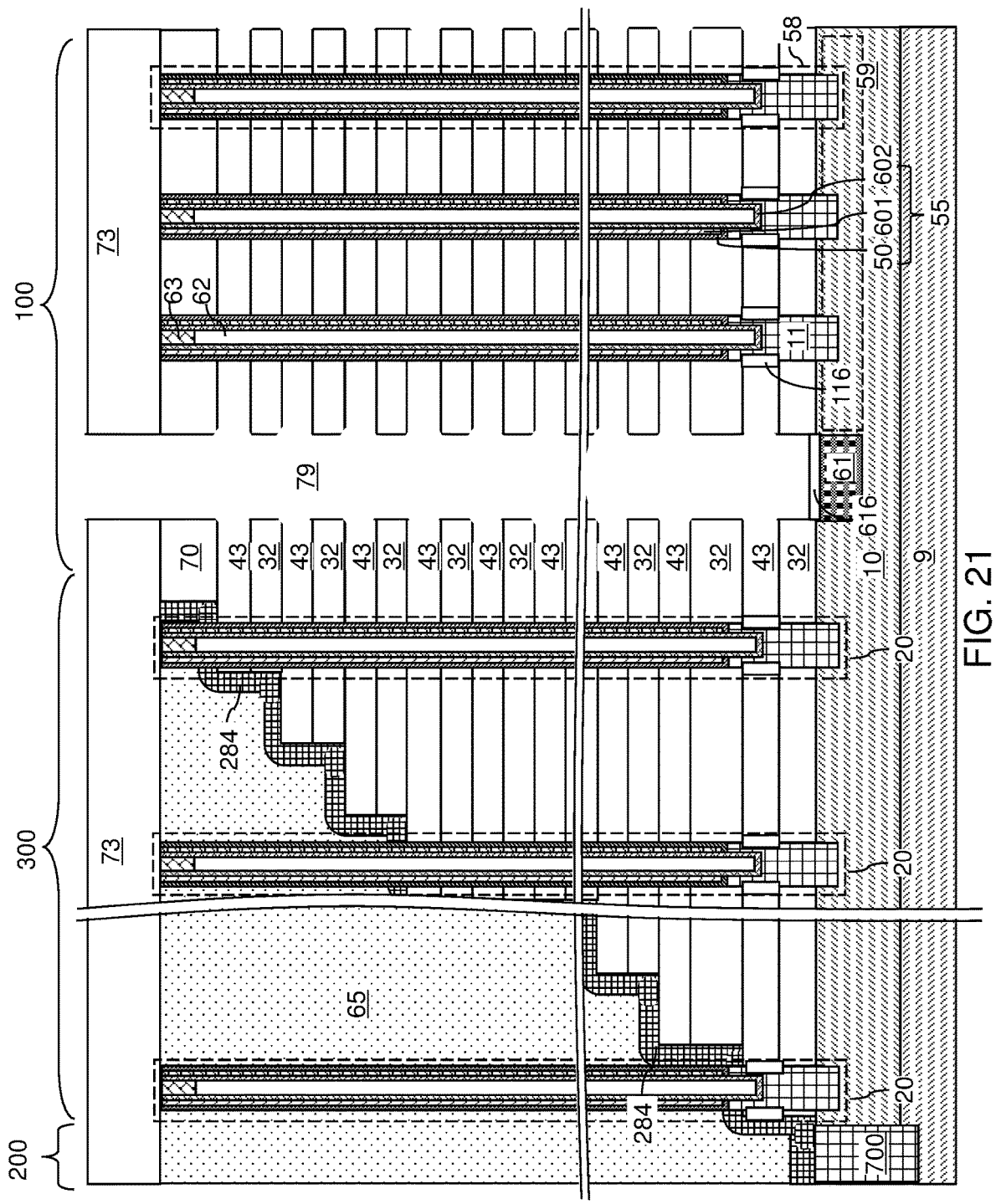

FIG. 21 is a schematic vertical cross-sectional view of the second exemplary structure after formation of backside recesses according to the second embodiment of the present disclosure.

Figure 22:
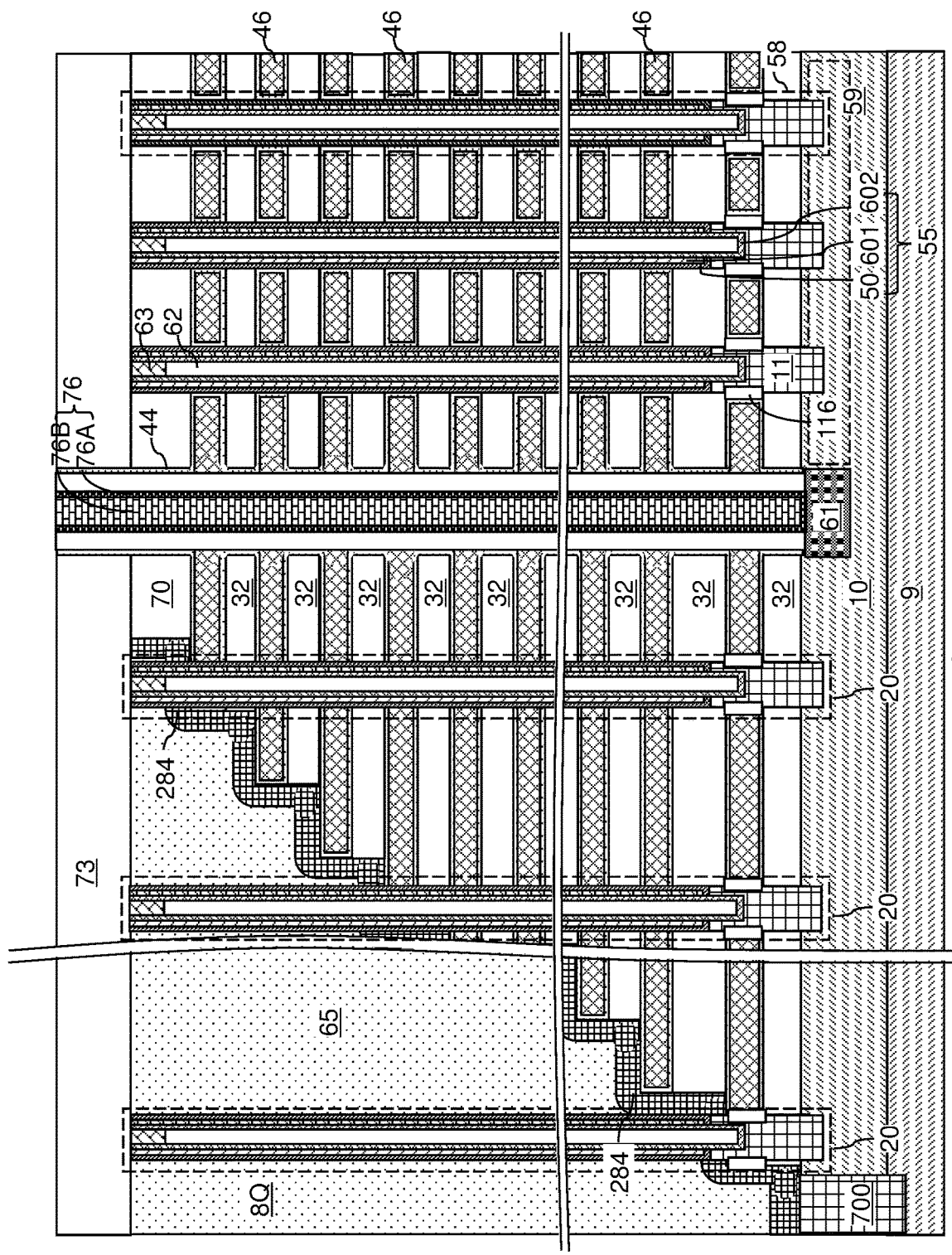

FIG. 22 is a schematic vertical cross-sectional view of the second exemplary structure after formation of electrically conductive layers, formation of an insulating spacer and a backside contact structure, and formation of additional contact via structures according to the second embodiment of the present disclosure.

Figure 23:
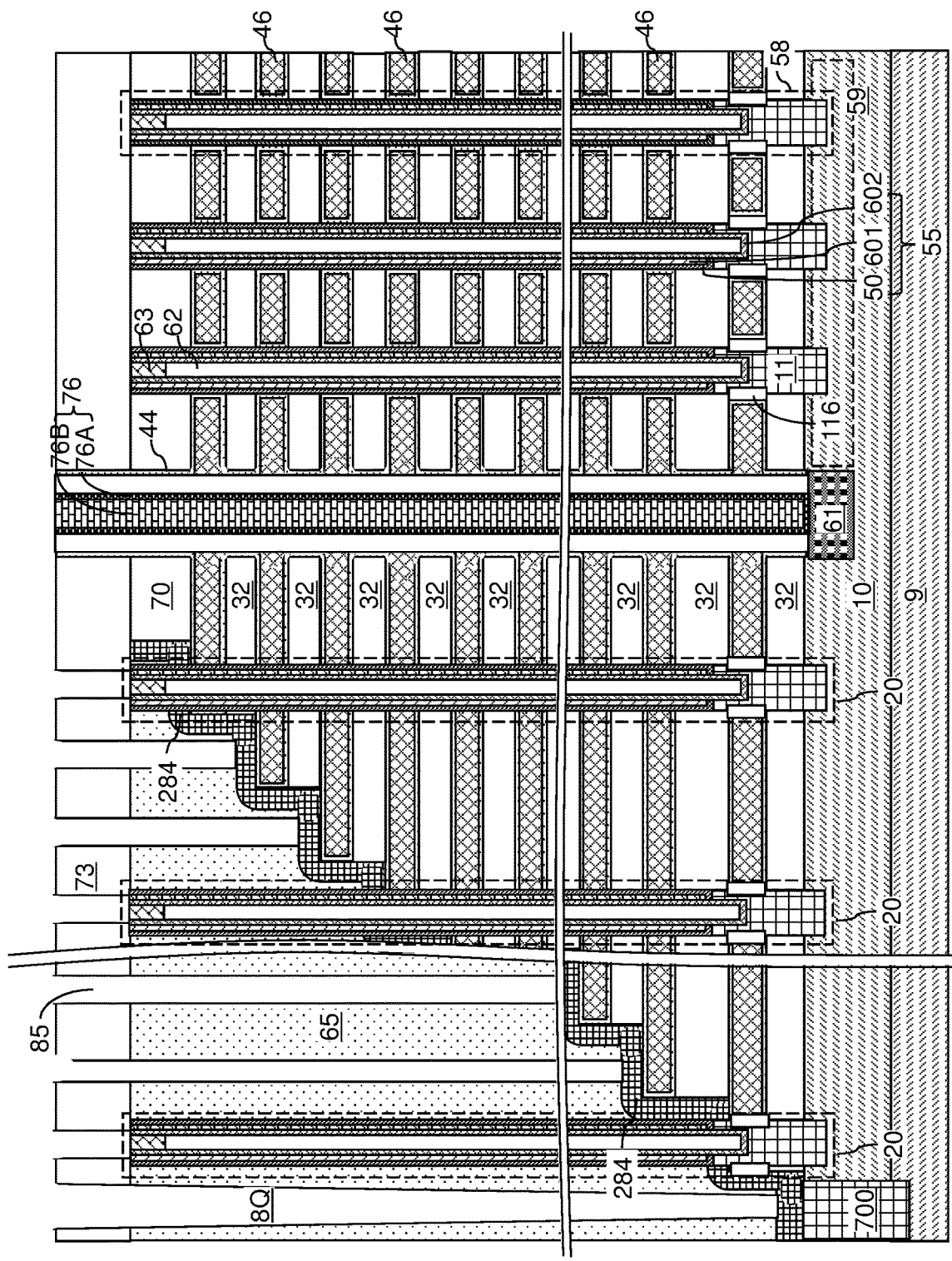

FIG. 23 is a schematic vertical cross-sectional view of the second exemplary structure after formation of contact via cavities according to the second embodiment of the present disclosure.

Figure 24:
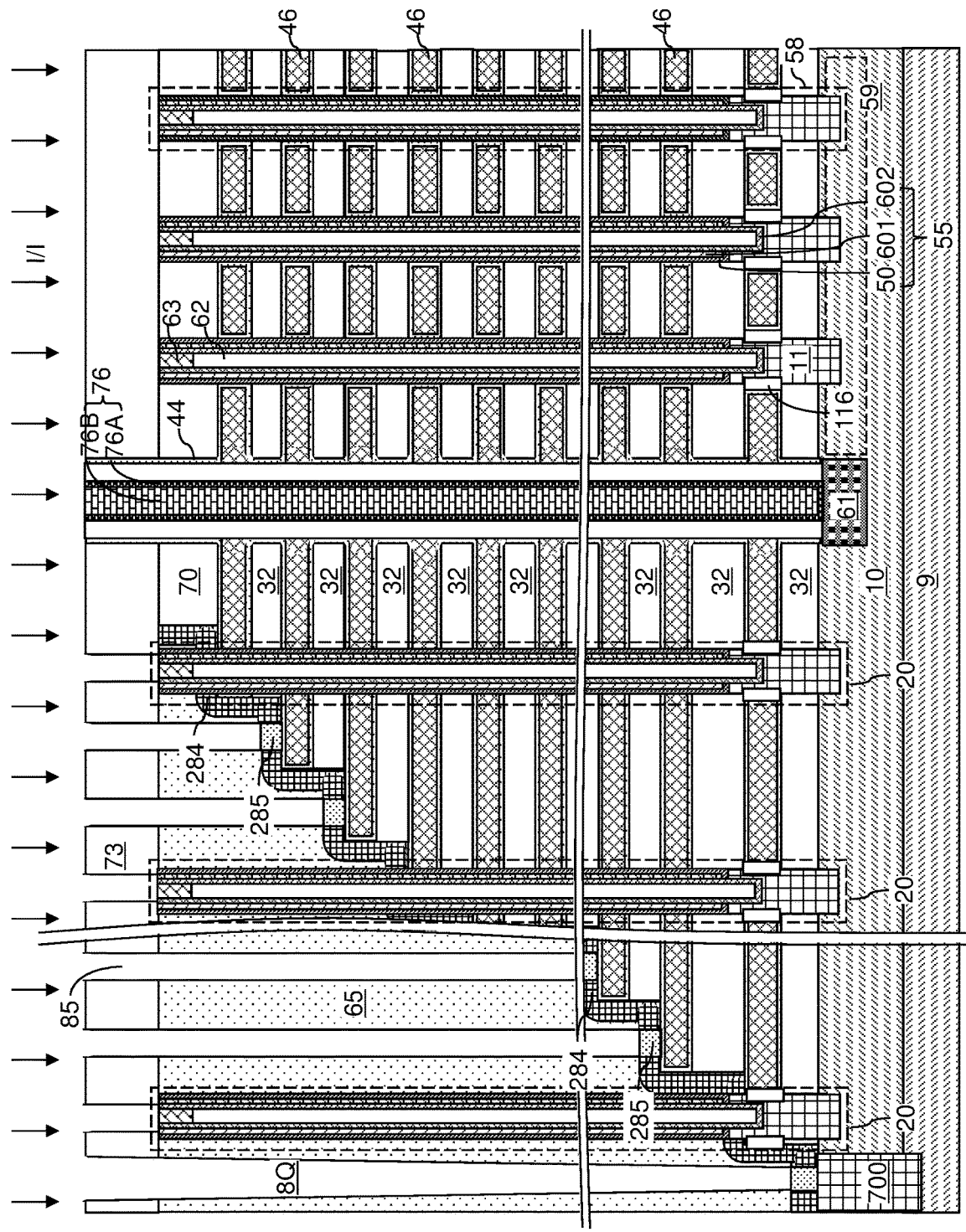

FIG. 24 is a schematic vertical cross-sectional view of the second exemplary structure after amorphization of portions of the etch stop layer that underlie the contact via cavities according to the second embodiment of the present disclosure.

Figure 25:
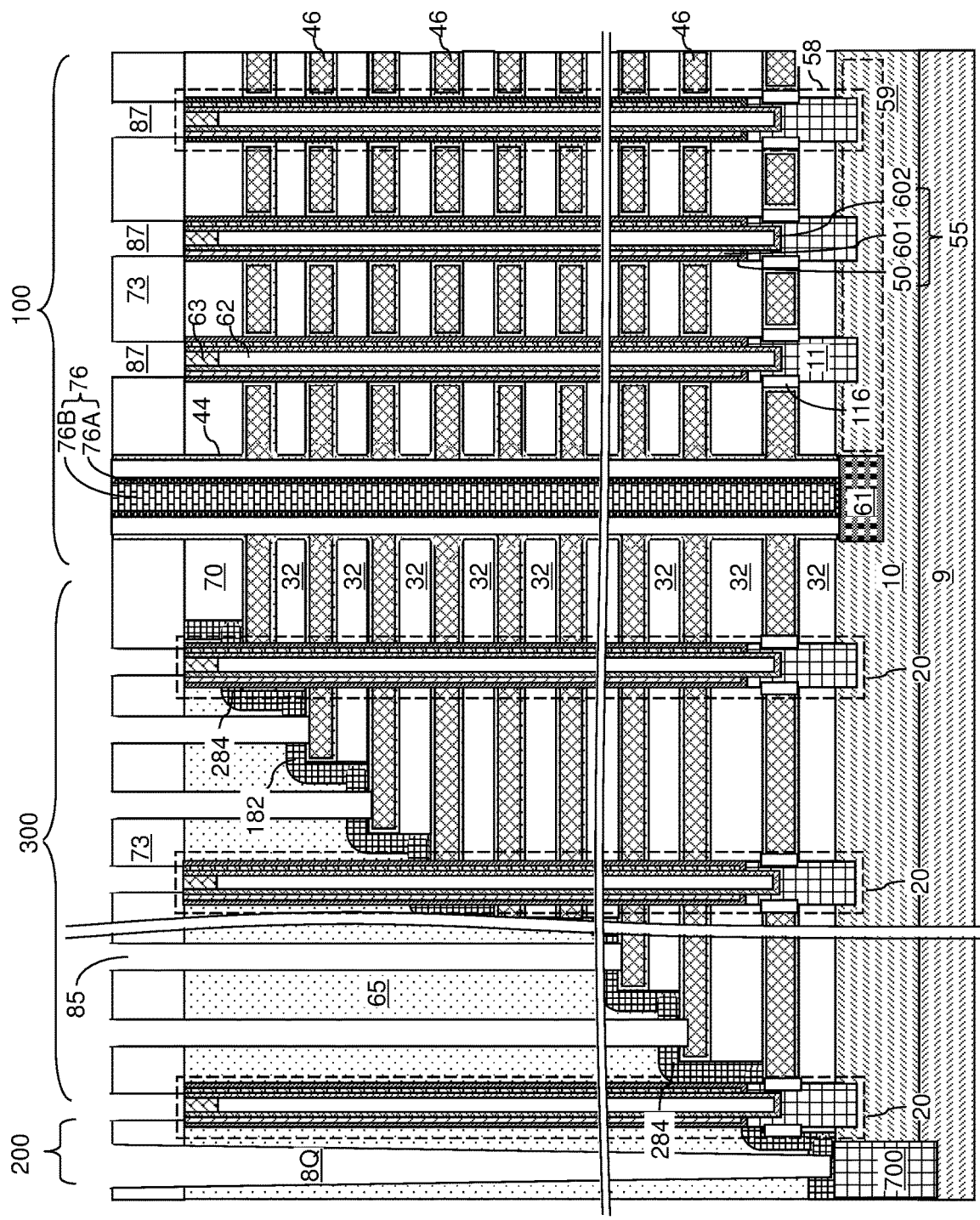

FIG. 25 is a schematic vertical cross-sectional view of the second exemplary structure after vertically extending the contact via cavities through the etch stop layer according to the second embodiment of the present disclosure.

Figure 26A:
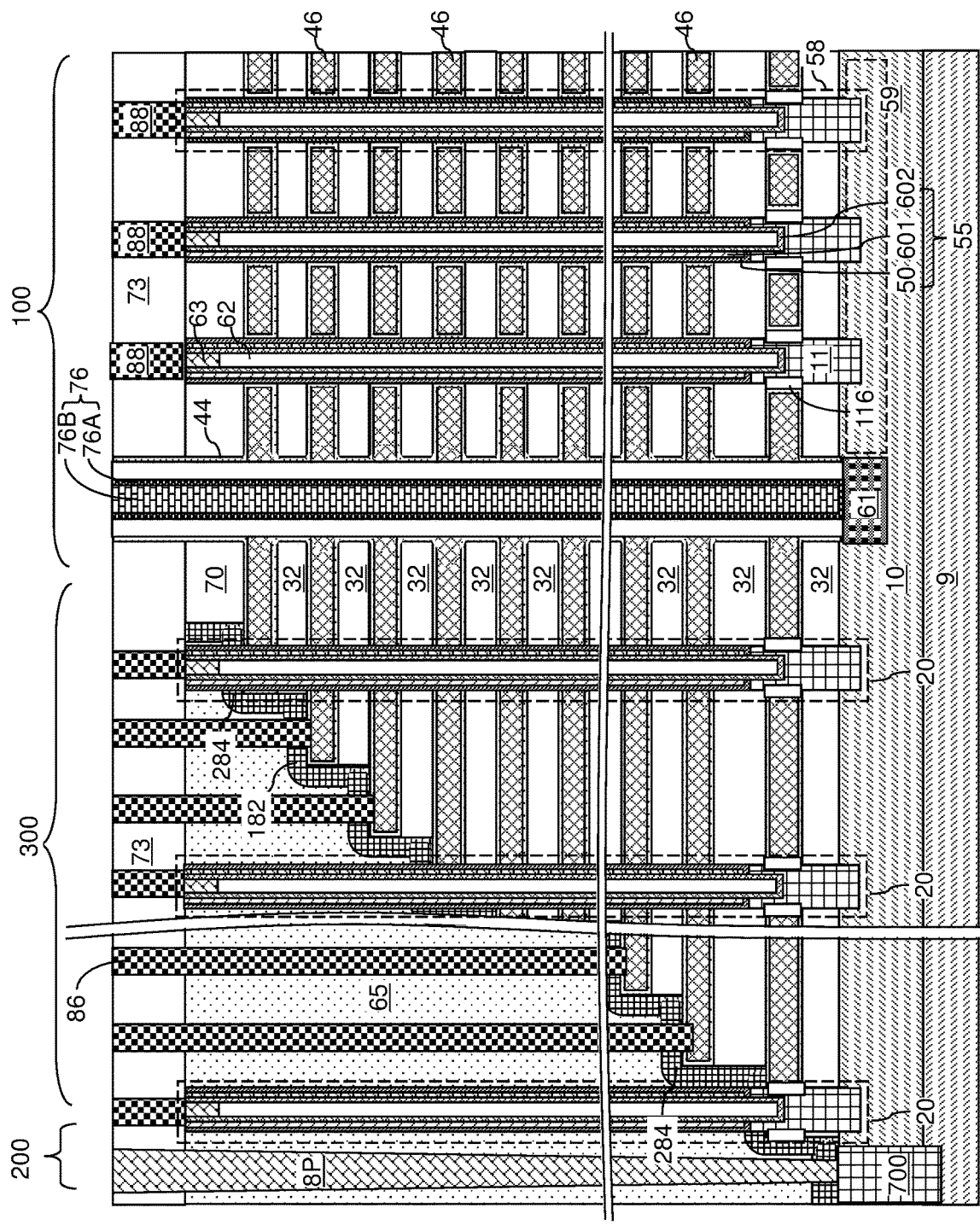

FIG. 26A is a schematic vertical cross-sectional view of the second exemplary structure after formation of various contact via structures according to the second embodiment of the present disclosure.

Figure 26B:
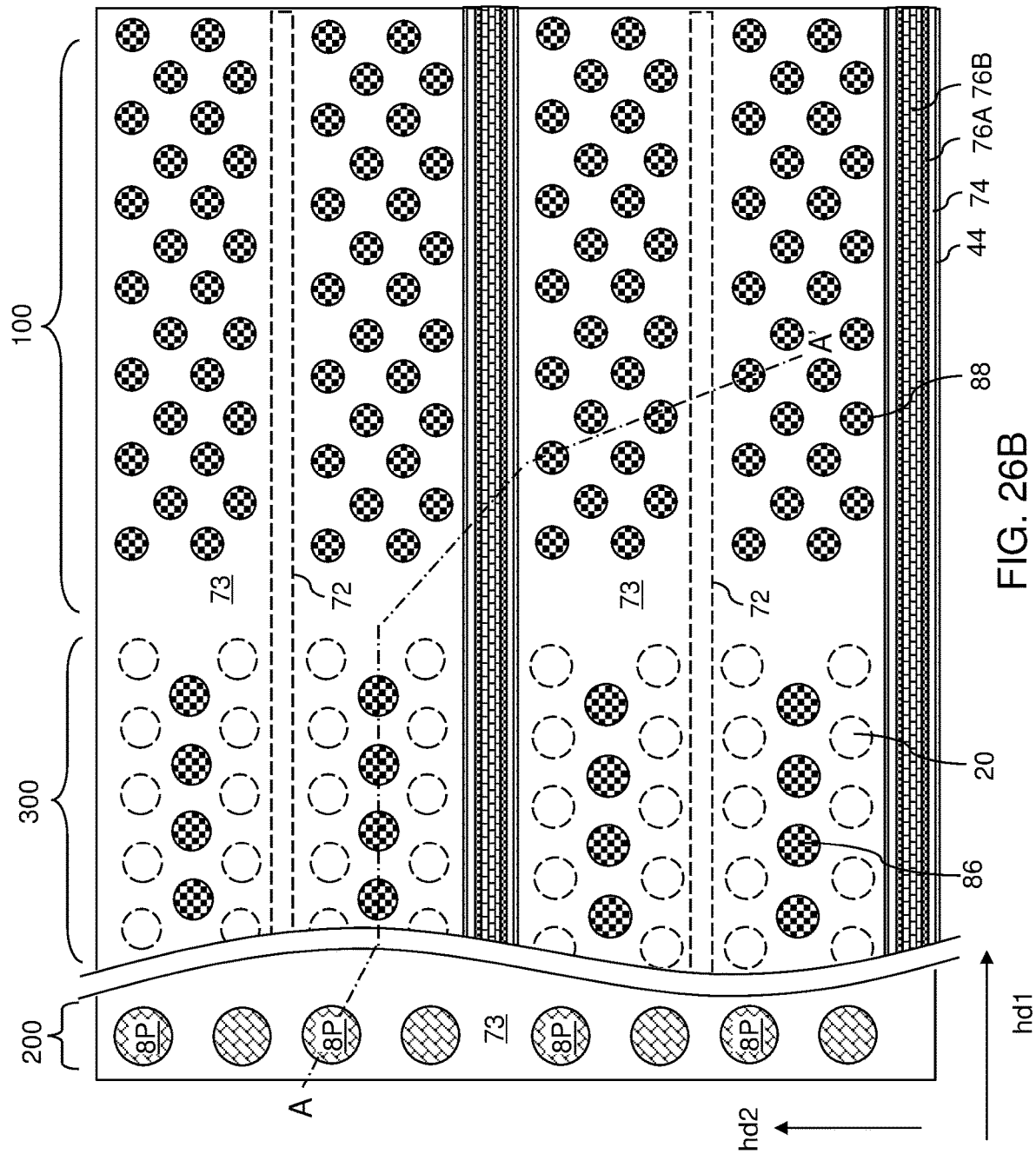

FIG. 26B is a top-down view of the second exemplary structure of FIG. 26A. The vertical plane A-A' is the plane of the schematic vertical cross-sectional view of FIG. 26A.

DETAILED DESCRIPTION

As discussed above, the present disclosure is directed to a three-dimensional memory device employing word-line etch stop liners and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1:
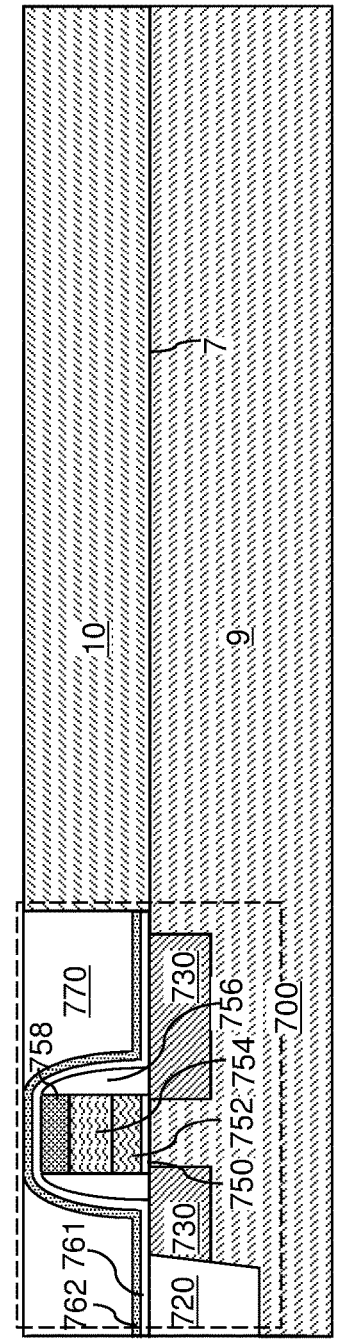
FIG. 1 is a schematic vertical cross-sectional view of a first exemplary structure after formation of at least one peripheral device, a semiconductor material layer, and a gate dielectric layer according to a first embodiment of the present disclosure.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one peripheral semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment, the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one peripheral semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one peripheral semiconductor device 700 is herein referred to as a peripheral region 200. The region in which a memory array is subsequently formed is herein referred to as a memory array region 100. A staircase region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
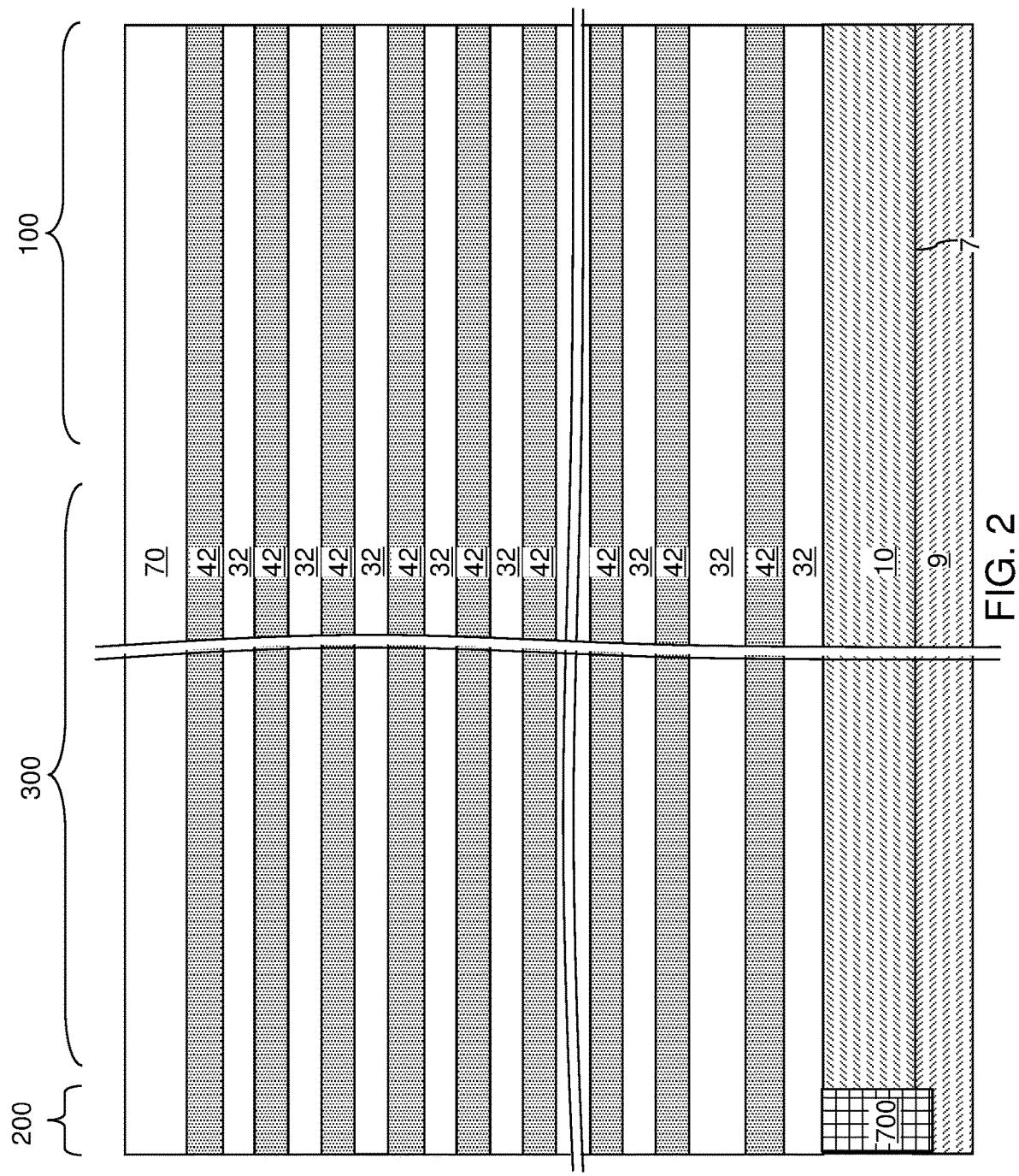
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In the first embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
FIG. 3 is a schematic vertical cross-sectional view of the first exemplary structure after formation of stepped terraces according to the first embodiment of the present disclosure.

Referring to FIG. 3, a stepped cavity can be formed within the staircase region 300 which is located between the memory array region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A staircase region is formed within the staircase region 300 by formation of the stepped cavity. Each sacrificial material layer 42 other than a topmost sacrificial material layer 42 within the alternating stack (32, 42) laterally extends farther than any overlying sacrificial material layer 42 within the alternating stack (32, 42). The staircase region includes stepped surfaces of the alternating stack (32, 42) that continuously extend from a bottommost layer within the alternating stack (32, 42) to a topmost layer within the alternating stack (32, 42). The sacrificial material layers 42 have a respective lateral extent that decreases as a function of a vertical distance from the substrate (9, 10) in the staircase region. Generally, stepped surfaces are formed in a staircase region 300 by patterning the alternating stack (32, 42). The alternating stack (32, 42) has variable lateral extents that decrease with a vertical distance from the substrate (9, 10) in the staircase region 300.

Figure 4:
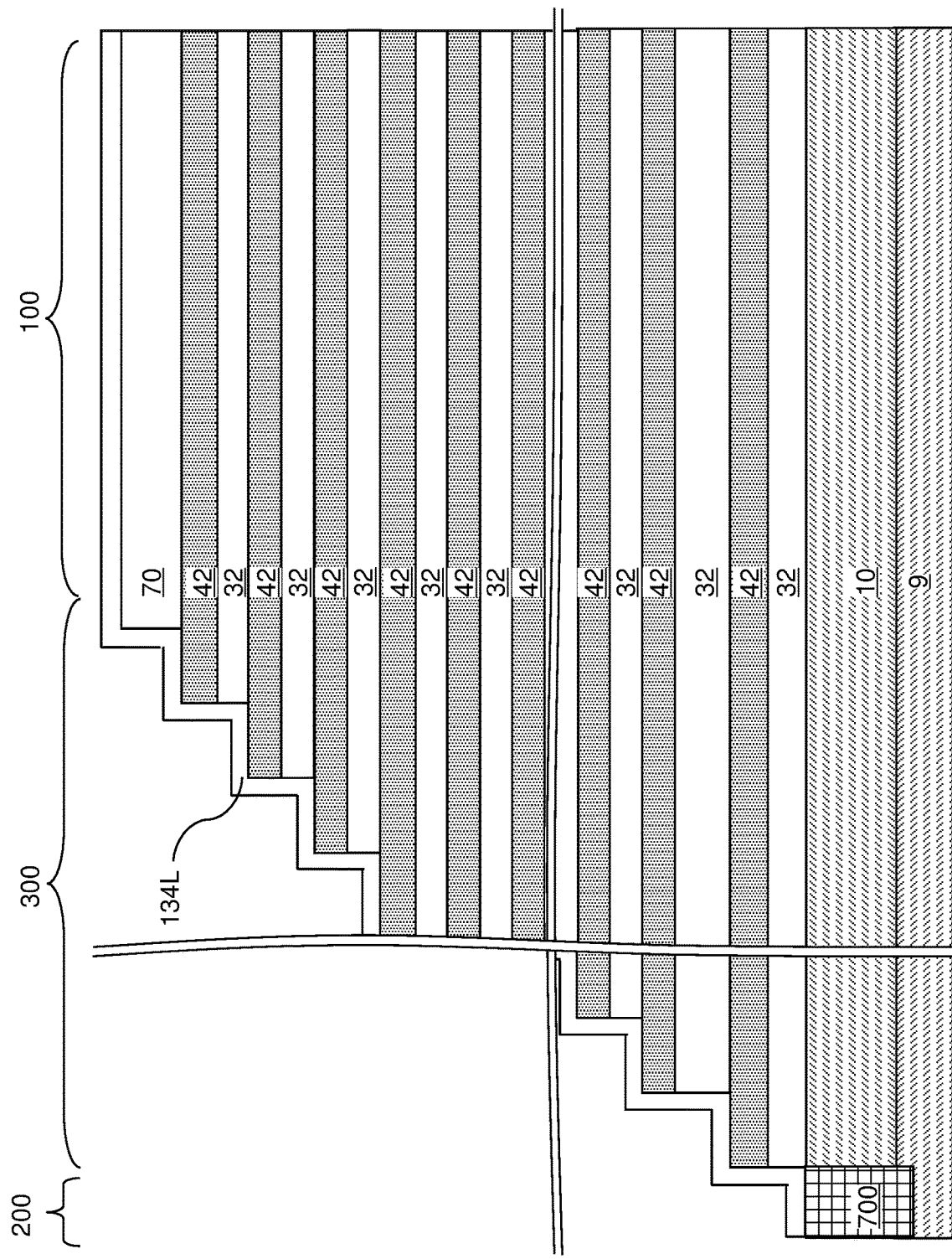
FIG. 4 is a schematic vertical cross-sectional view of the first exemplary structure after formation of a dielectric spacer material layer according to the first embodiment of the present disclosure.

Referring to FIG. 4, a dielectric spacer material layer 134L is formed on the stepped surfaces of the alternating stack (32, 42) in the staircase region 300, over the insulating cap layer 70, and over physically exposed surfaces in the peripheral device region 200. The dielectric spacer material layer 134L includes a dielectric material that is different from the material of the sacrificial material layers 42. In one embodiment, the dielectric spacer material layer 134L includes a dielectric material that is different from silicon nitride. For example, the dielectric spacer material layer 134L can include silicon oxide or a dielectric metal oxide such as aluminum oxide. The dielectric spacer material layer 134L can be deposited by a conformal deposition process such as chemical vapor deposition or atomic layer deposition. The thickness of the dielectric spacer material layer 134L can have a thickness in a range from 3 nm to 30 nm, such as from 5 nm to 10 nm, although lesser and greater thicknesses can also be employed.

Figure 5:
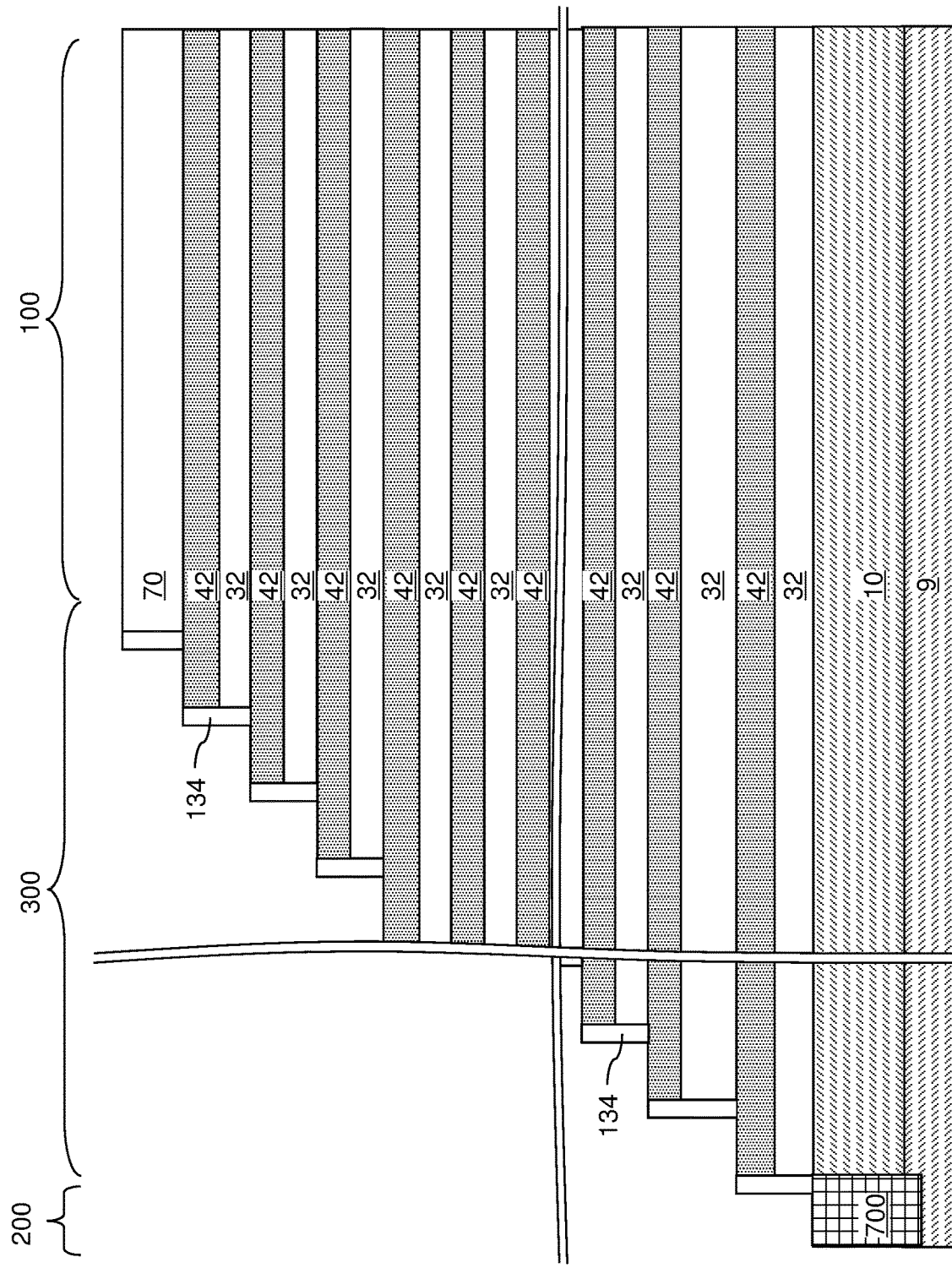
FIG. 5 is a schematic vertical cross-sectional view of the first exemplary structure after formation of dielectric spacers according to the first embodiment of the present disclosure.

Referring to FIG. 5, an anisotropic etch process can be performed to remove horizontal portions of the dielectric spacer material layer 134L. Horizontal surfaces of the sacrificial material layers 42 can be employed as stopping surfaces for the anisotropic etch process. Each remaining vertical portion of the dielectric spacer material layer 134L constitutes a dielectric spacer 134. The dielectric spacers 134 are formed on sidewalls of vertically neighboring pairs of an insulating layer 32 and an overlying sacrificial material layer 42 (i.e., on a sidewall of each step). As such, each dielectric spacer 134 contacts vertically coincident sidewalls of a neighboring pair of an underlying insulating layer 32 and an overlying sacrificial material layer 42. In one embodiment, more than 90% of the area of each sidewall of the sacrificial material layers in the staircase region may be contacted by a respective one of the dielectric spacers 134. In one embodiment, 100% of the area of each sidewall of the insulating layers 32 in the staircase region can be contacted by a respective one of the dielectric spacers 134.

Figure 6A:
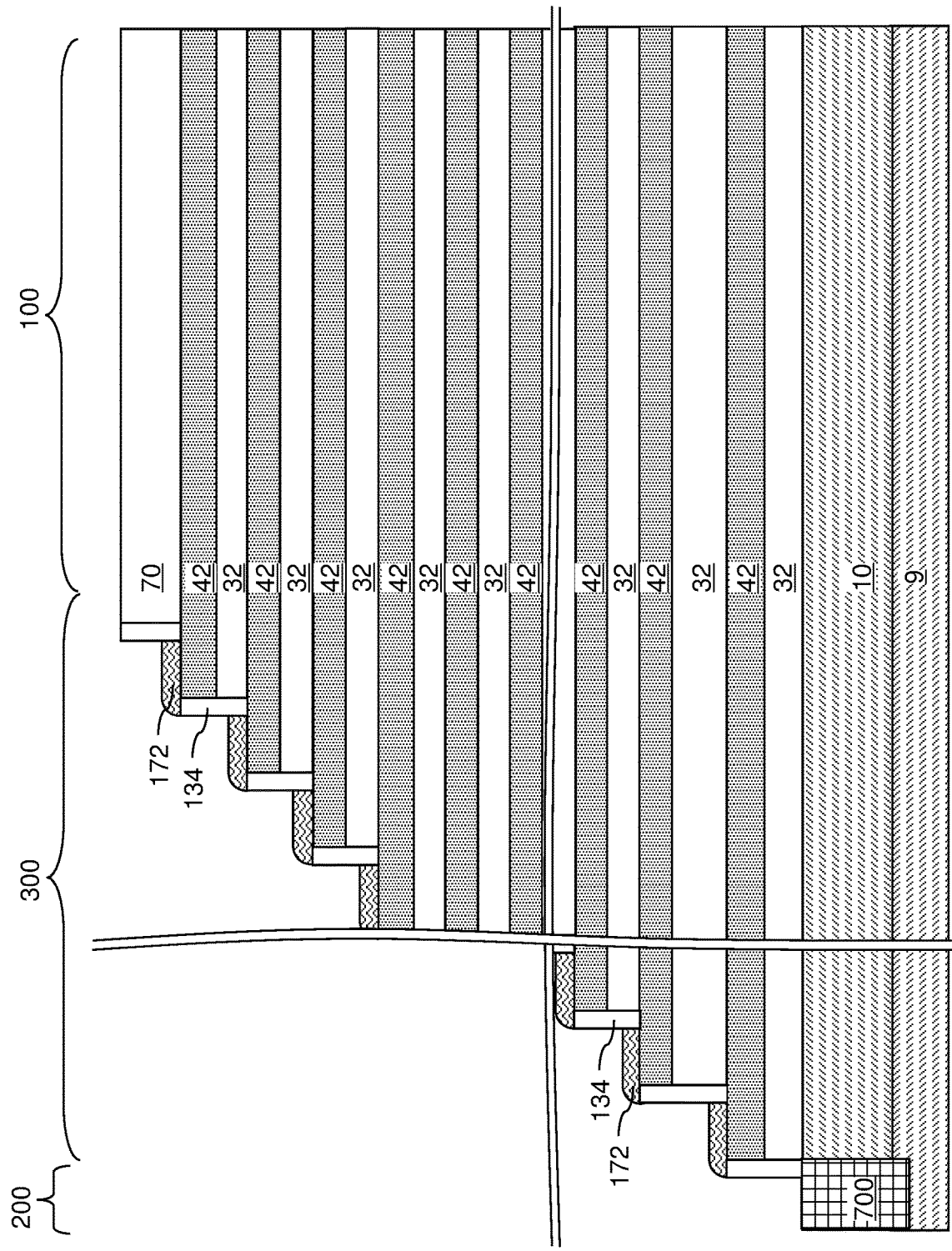
FIG. 6A is a schematic vertical cross-sectional view of the first exemplary structure after formation of semiconductor material plates from physically exposed surfaces of the sacrificial material layers according to the first embodiment of the present disclosure.

Referring to FIG. 6A, semiconductor material plates 172 are formed on physically exposed surfaces of the sacrificial material layers 42 in the staircase region employing a selective deposition process. In a selective deposition process, a material grows from the physically exposed surfaces of the sacrificial material layers 42 and does not grow from surfaces of the dielectric spacers 134. Generally, the semiconductor material plates 172 are formed over physically exposed horizontal surfaces of the sacrificial material layers 42 in the staircase region 300 employing the selective deposition process, in which a semiconductor material selectively grows from the physically exposed horizontal surfaces of the sacrificial material layers 42.

In one embodiment, the sacrificial material layers 42 can comprise silicon nitride, the insulating layers 32 can comprise silicon oxide or a dielectric metal oxide, and the selective deposition process deposits a semiconductor material on the silicon nitride surfaces of the sacrificial material layers 42 as the semiconductor material plates 172 without growing the semiconductor material from the surfaces of the dielectric spacers 134 or from the top surface of the insulating cap layer 70. In this case, an incubation time difference for deposition of the semiconductor material between the silicon nitride surfaces of the sacrificial material layers 42 and the silicon oxide surfaces or the dielectric metal oxide surfaces of the dielectric spacers 134 can be employed to induce deposition of the semiconductor material plates 172 from silicon nitride surfaces of the sacrificial material layers 42 without growing any semiconductor material from surfaces of the dielectric spacers 134. Optionally, the end portions of the semiconductor material plates 172 can also be formed over top surfaces of the dielectric spacers 134 as the semiconductor material laterally grows over the top surface of the dielectric spacers 134. The end portions of the semiconductor material plates 172 can have a respective convex surface.

The incubation time for nucleation of a semiconductor material on silicon nitride surfaces less than the incubation time for nucleation of the semiconductor material on silicon oxide surfaces or dielectric metal oxides. The semiconductor material may comprise amorphous silicon, polysilicon, or a silicon-germanium alloy. Optionally, an etch back process may be performed to remove any nucleation on the surfaces of the dielectric spacers 134. Optionally, a deposition step and an etch back step may be repeated multiple times to deposit the semiconductor material plates 172. The thickness of the semiconductor material plates 172 may be in a range from 1 nm to 20 nm, such as from 2 nm to 10 nm such as from 3 nm to 6 nm, although lesser and greater thicknesses can also be employed.

Figure 6B:
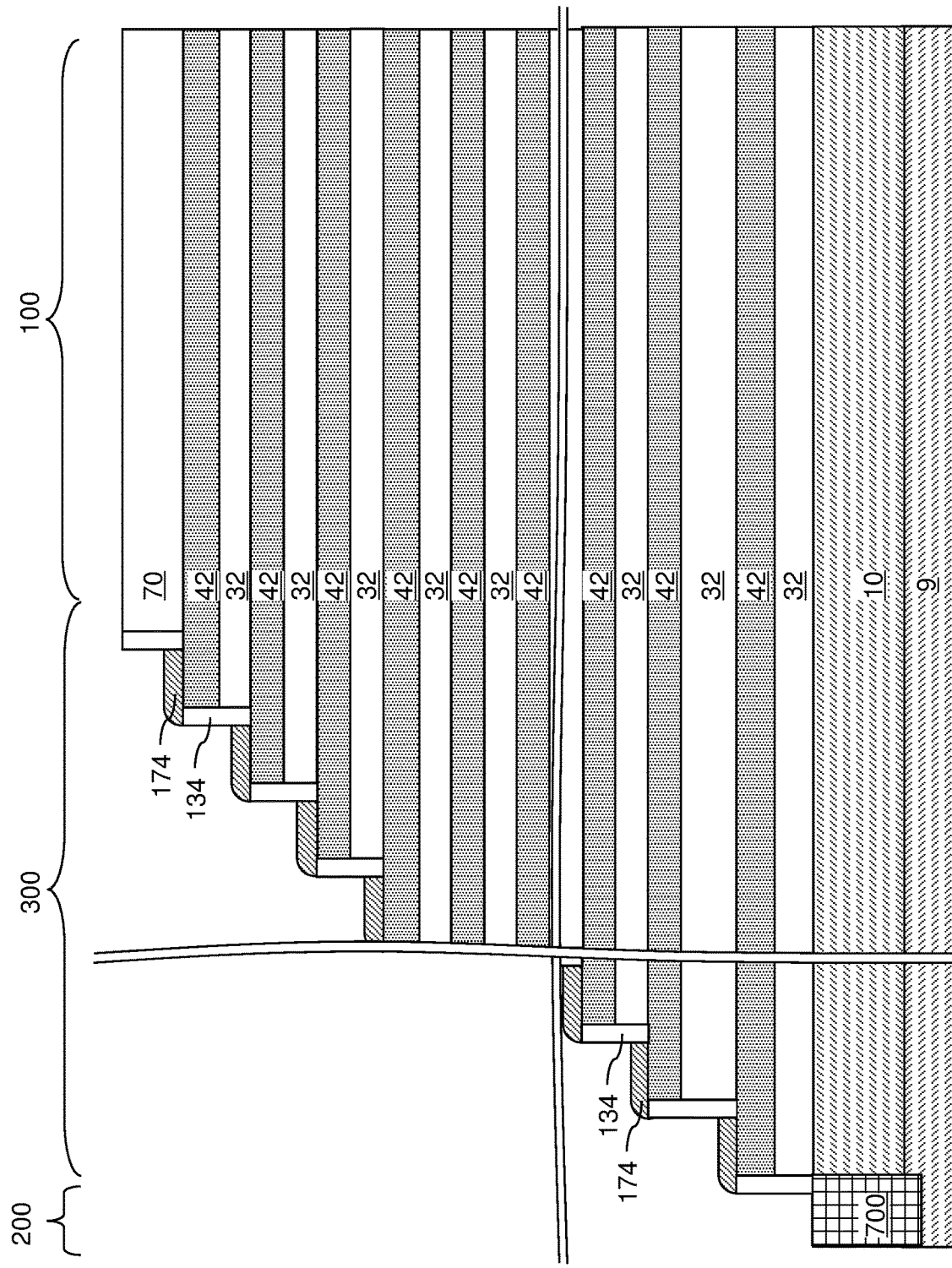

Referring to FIG. 6B, an optional metal deposition process may be performed to convert the semiconductor material plates 172 into metal plates 174. In this case, portions of a metal can be nucleated by providing a reactant that consumes the semiconductor material of the semiconductor material plates 172 during nucleation. Metal plates 174 comprising the metal and residual atoms of the semiconductor material can be formed.

In one embodiment, the first exemplary structure may be placed in a vacuum-tight process chamber, and a metal-containing precursor gas can be flowed into the process chamber to induce nucleation of a metal on the semiconductor material plates 172. For example, tungsten hexafluoride may be flowed into the process chamber, and a predominant fraction of the semiconductor material of the semiconductor material plates 172 may be consumed as a sacrificial nucleation material during formation of the metal plates 174. In this case, the semiconductor material of the semiconductor material plates 172 may be employed as a sacrificial nucleation material that induces decomposition of the metal-containing precursor gas and substantially consumed during nucleation and subsequent deposition of the metallic material that forms the metal plates 174. In one embodiment, the metal plates 174 may comprise tungsten and may include a semiconductor material (such as silicon) at an atomic percentage that is less than 10%, such as less than 5% and/or less than 2%. The thickness of the metal plates 174 (in case the metal plates 174 replaces the semiconductor material plates 172) may be in a range from 1 nm to 20 nm, such as from 2 nm to 10 nm such as from 3 nm to 6 nm, although lesser and greater thicknesses can also be employed.

Referring to FIG. 7, an ion implantation process can be performed to implant at least one element selected from carbon and nitrogen into the metal plates 174 as formed at the processing steps of FIG. 6B, or into the semiconductor material plates 172 as formed in the processing steps of FIG. 6A in case the processing steps of FIG. 6B are not performed. The metal plates 174 or the semiconductor material plates 172 are converted into the etch stop plates 182 by the ion implantation process.

Generally, the semiconductor material plates 172 are converted into etch stop plates 182 having a different material composition than the semiconductor material plates 172, either through formation of intermediate structures such as the metal plates 174 or directly without formation of intermediate structures such as the metal plates 174. In one embodiment, the etch stop plates 182 comprise a material selected from tungsten nitride, tungsten carbide, tungsten carbonitride or silicon carbide (e.g., WN, WC, WCN, or SiC).

In one embodiment, the etch stop plates 182 comprise a compound of a metal and at least one non-metallic element selected from nitrogen and carbon. In one embodiment, the etch stop plates 182 can be formed by formation of semiconductor material plates 172, by conversion of the semiconductor material plates 172 into metal plates 174, and by conversion of the metal plates 174 into the etch stop plates 182. In one embodiment, the metal plates 174 can be formed by decomposition of a tungsten-containing precursor gas on the semiconductor material plates 172, consumption of a predominant fraction of the semiconductor material plates 172, growth of tungsten from nucleated tungsten material portions, and implantation of nitrogen atoms, carbon atoms, or a combination of nitrogen atoms and carbon atoms into the metal plates 174. In one embodiment, the etch stop plates 182 comprise a material selected from WN, WC, or WCN. In one embodiment, the etch stop plates 182 comprise silicon atoms at an average atomic concentration that is in a range from 0.01 percent to 5 percent, such as from 0.1% to 2%, and an atomic concentration of the silicon atoms in the etch stop plates 182 decreases with a vertical distance from the substrate (9, 10) within each of the etch stop plates 182.

In one embodiment, the etch stop plates 182 comprise silicon carbide in which atomic percentage of carbon is in a range from 35% to 65%. In one embodiment, the etch stop plates 182 can be formed by formation of semiconductor material plates 172, and by conversion of the semiconductor material plates 172 into the etch stop plates 182 by implantation of carbon atoms therein. In other words, the etch stop plates 182 can be formed from the semiconductor material plates 172 by implanting carbon atoms into the semiconductor material plates. In one embodiment, the dose of carbon atoms during the implantation process can be selected such that the etch stop plates 182 comprise, and/or consist essentially of, silicon carbide.

Generally, each of the etch stop plates 182 has a respective thickness that is less than a minimum thickness of the electrically conductive layers to be subsequently formed by replacement of the sacrificial material layers 42. In one embodiment, each of the etch stop plates 182 has a respective thickness that is less than a minimum thickness of the sacrificial material layers 42. In one embodiment, each of the etch stop plates 182 may comprise a planar bottom surface (located within a respective horizontal plane), a vertical sidewall adjoined to a first edge of the planar bottom surface (and contacting a bottom segment of an outer sidewall of an insulating spacer 134), a convex surface segment adjoined to a second edge of the planar bottom surface (and overlying a top surface of another insulating spacer 134), and a planar top surface adjoined to a top end of the vertical sidewall and adjoined to an upper edge of the convex surface segment. The thickness of the etch stop plates 182 may be in a range from 1 nm to 30 nm, such as from 2 nm to 15 nm such as from 3 nm to 10 nm, although lesser and greater thicknesses can also be employed.

In one embodiment, the dielectric spacers 134 can be located in the staircase region 300. Each of the dielectric spacers 134 other than a topmost dielectric spacer 134 and a bottommost dielectric spacer 134 contacts a sidewall of a respective one of the insulating layers 32 and contacts a respective pair of etch stop plates 182 of the etch stop plates 182. In one embodiment, each of the dielectric spacers 134 other than the topmost dielectric spacer 134 and the bottommost dielectric spacer 134 contacts a bottom surface of a first etch stop plate 182 within the respective pair of etch stop plates 182 and contacts a sidewall of a second etch stop plate 182 within the respective pair of etch stop plates 182.

Referring to FIGS. 8A and 8B, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

The retro-stepped dielectric material portion 65 can be formed on the sidewalls of the dielectric spacers 134. Each dielectric spacer 134 can contact a respective sidewall of the retro-stepped dielectric material portion 65. Further, the retro-stepped dielectric material portion 65 can contact each of the etch stop plates 182. Each of the etch stop plates 182 can include a horizontal surface and a tapered or curved surface that contact a respective bottom surface of the retro-stepped dielectric material portion 65. The sacrificial material layers 42 are laterally and vertically spaced from the retro-stepped dielectric material portion 65 by the etch stop plates 182 and the dielectric spacers 134.

A lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. In one embodiment, each of the support openings 19 can vertically extend through at least one semiconductor material plate 172. In one embodiment, at least one of the support openings 19 can vertically extend through only one of the semiconductor material plates 172. Alternatively or additionally, at least one of the support openings 19 can vertically extend through a respective pair of the semiconductor material plates 172. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 9A-9H illustrate structural changes in a memory opening 49, which is one of the memory openings 49 in the exemplary structure of FIGS. 8A and 8B. The same structural change occurs simultaneously in each of the other memory openings 49 and in each support opening 19.

Referring to FIG. 9A, a memory opening 49 in the exemplary device structure of FIGS. 8A and 8B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 9B, an optional pedestal channel portion 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 9C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($La_2O_3$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 9E, a second semiconductor channel layer 602 can be deposited directly on the semiconductor surface of the pedestal channel portion 11 or the semiconductor substrate layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening. The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9H:
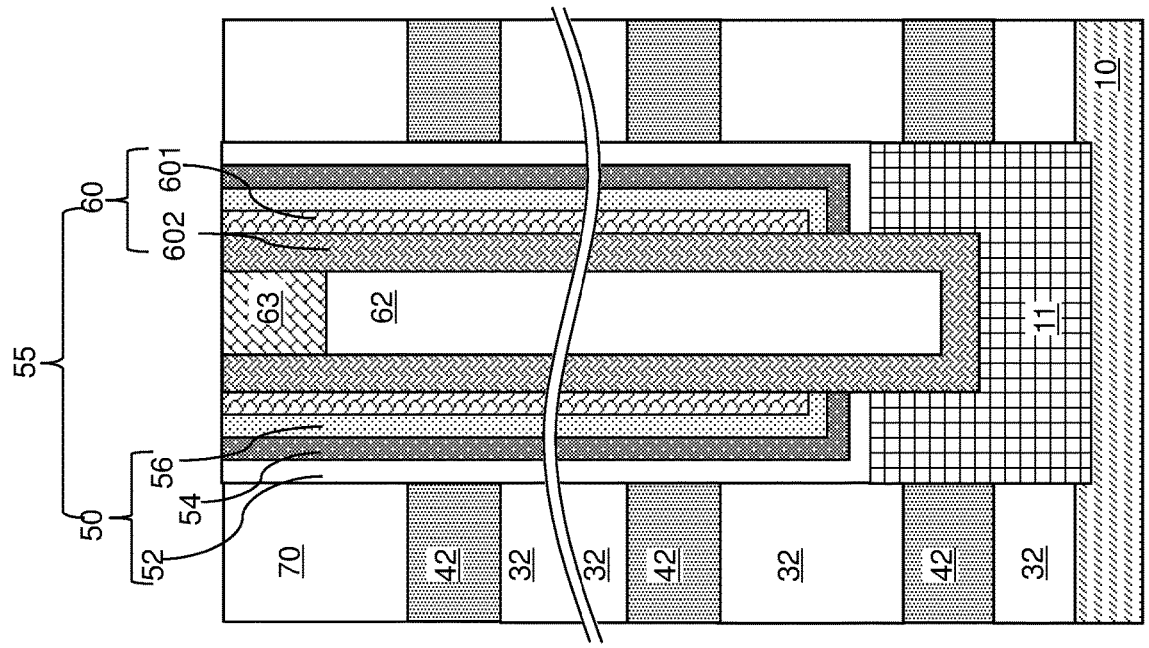
Figure 9G:
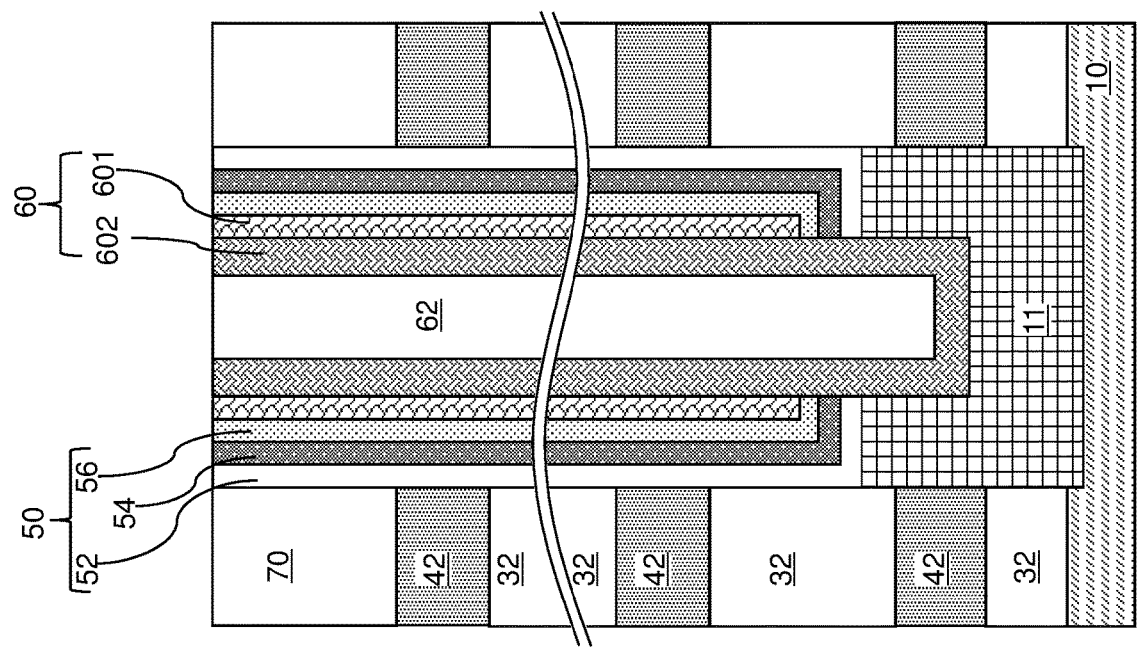

Referring to FIG. 9G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 9H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52.

Referring to FIG. 10, the exemplary structure is illustrated after formation of memory opening fill structures 58 and support pillar structure 20 within the memory openings 49 and the support openings 19, respectively. Each combination of a pedestal channel portion 11 (if present), a memory stack structure 55, a dielectric core 62, and a drain region 63 within a memory opening 49 is herein referred to as a memory opening fill structure 58. An instance of a memory opening fill structure 58 can be formed within each memory opening 49 of the structure of FIGS. 8A and 8B. An instance of the support pillar structure 20 can be formed within each support opening 19 of the structure of FIGS. 8A and 8B. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

A two-dimensional array of support pillar structures 20 can be formed in the contact region 300. In one embodiment, each of the support pillar structures 20 can vertically extend through at least one etch stop plate 182. In one embodiment, at least one of the support pillar structures 20 can vertically extend through only one of the etch stop plates 182. Alternatively or additionally, at least one of the support pillar structures 20 can vertically extend through a respective pair of the etch stop plates 182. A support pillar structure 20 may, or may not, directly contact a dielectric spacer 134.

Referring to FIGS. 11A and 11B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. In one embodiment, the backside trenches 79 can laterally extend along a first horizontal direction hd1, and can be laterally spaced among one another along a second horizontal direction hd2. In one embodiment, each backside trench 79 can be a line trench having a uniform width that is invariant with translation with the lengthwise direction, i.e., the first horizontal direction hd1. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of a respective overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Referring to FIGS. 12 and 13A, an etchant that selectively etches the second material of the sacrificial material layers 42 with respect to the first material of the insulating layers 32 and the etch stop plates 182 can be introduced into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the etch stop plates 182, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 are removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 13B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed on all physically exposed surfaces in the backside recesses 43. The backside blocking dielectric layer 44 can be formed directly on inner sidewalls of the dielectric spacers 134 and the bottom surfaces of the etch stop plates 182. The backside blocking dielectric layer 44 is formed on horizontal bottom surfaces of the insulating layers 32 other than the bottommost one of the insulating layers 32, and on horizontal top surfaces of each of the insulating layers 32. The backside blocking dielectric layer 44 is formed on physically exposed portions of the sidewalls of the memory opening fill structures 58 and the support pillar structures 20. The backside blocking dielectric layer 44 can be formed and on a sidewall of the backside trench 79.

The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 13C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIGS. 13D, 14A, and 14B, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with a electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46. Each electrically conductive layer 46 can function as a word line integrated with control gate electrodes for NAND arrays, a source select gate electrode, or a drain select gate electrode.

Referring to FIGS. 15A and 15B, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

An insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 2 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

In one embodiment, each of the electrically conductive layers 46 is embedded within a respective backside blocking dielectric layer 44, and the planar bottom surface of each of the etch stop plates 182 contacts a top surface of a respective one of the backside blocking dielectric layers 44. In one embodiment, each of the etch stop plates 182 comprises a planar bottom surface, a vertical sidewall adjoined to a first edge of the planar bottom surface, a convex surface segment adjoined to a second edge of the planar bottom surface, and a planar top surface adjoined to a top end of the vertical sidewall and adjoined to an upper edge of the convex surface segment. The etch stop plates 182 may comprise a conductive material such as tungsten nitride, tungsten carbide, tungsten carbonitride, or may comprise a dielectric (i.e., insulating) material such as silicon carbide.

Referring to FIGS. 16A and 16B, a photoresist layer can be applied over the contact-level dielectric layer 73, and can be lithographically patterned to form a pattern of openings therein. An anisotropic etch process can be performed to etch through the contact-level dielectric layer 73 and the retro-stepped dielectric material portion 65. The anisotropic etch process may comprise a first etch step that etches the materials of the contact-level dielectric layer 73 and the retro-stepped dielectric material portion 65 selective to the material of the etch stop plates 182, a second etch step that etches the material of the etch stop plates 182, and an optional third etch step that etches the material of the backside blocking dielectric layers 44 (in case the backside blocking dielectric layers 44 are present) selective to the material of the electrically conductive layers 46. In one embodiment, the second etch step may have an etch chemistry that etches the material of the etch stop plates 182 selective to the material of the backside blocking dielectric layers 44. Contact via cavities are formed through the retro-stepped dielectric material portion 65. The contact via cavities may include word-line contact via cavities vertically extending through the contact-level dielectric layer 73, the retro-stepped dielectric material portion 65, a respective one of the etch stop plates 182, and optionally a respective one of the backside blocking dielectric layers 44 (in case the backside blocking dielectric layers 44 are present). In additional, the contact via cavities may include peripheral contact via cavities vertically extending through the contact-level dielectric layer 73 and the retro-stepped dielectric material portion 65 to a conductive node of a respective peripheral semiconductor device 700 in the peripheral region 200. Drain contact via cavities can be formed through the contact-level dielectric layer 73 over the drain regions 63. The drain contact via cavities may be formed concurrently with, prior to or after formation of the word-line contact via cavities.

At least one conductive material, such as at least one metallic material, can be deposited in the various contact via cavities, and excess portions of the at least one conductive material can be removed from above the horizontal plane including the top surface of the contact-level dielectric layer 73. Remaining portions of the at least one conductive material comprise various contact via structures (86, 88, 8P). The contact via structures (86, 88, 8P) comprise word-line contact via structures 86 in contact with a respective one of the electrically conductive layers 46 and with a respective one of the etch stop plates 182, drain contact via structures 88 in contact with a respective one of the drain regions 63, and peripheral contact via structures 8P in contact with a respective one of the peripheral semiconductor devices 700 within the peripheral region 200.

Referring to FIG. 17, a second exemplary structure according to a second embodiment of the present disclosure can be derived from the first exemplary structure illustrated in FIG. 3 by conformally depositing an etch stop layer 282 that continuously extends over the stepped surfaces from a bottommost layer within the alternating stack (32, 42) to a topmost layer within the alternating stack (32, 42). In one embodiment, the etch stop layer 282 comprises a dielectric material that can be conformally deposited by a conformal deposition process such as an atomic layer deposition (ALD) process or a chemical vapor deposition (CVD) process. In one embodiment, the etch stop layer 282 comprises a dielectric material having an amorphous phase and a crystalline phase. For example, the etch stop layer 282 comprises, and/or consists essentially of, aluminum oxide or silicon carbide. In one embodiment, the entirety of the etch stop layer 282 can be deposited as a continuous amorphous dielectric material layer. In this case, the etch stop layer 282 can be an amorphous dielectric etch stop layer. In one embodiment, the etch stop layer 282 may have a thickness in a range from 1 nm to 30 nm, such as from 2 nm to 15 nm and/or from 3 nm to 10 nm, although lesser and greater thicknesses may also be employed.

Referring to FIG. 18, a retro-stepped dielectric material portion 65 (i.e., an insulating fill material portion) can be formed in the stepped cavity by deposition and planarization of a dielectric material. For example, a dielectric material such as silicon oxide can be deposited in the stepped cavity. Excess portions of the deposited dielectric material can be removed from above the top surface of the insulating cap layer 70, for example, by chemical mechanical planarization (CMP). A horizontally-extending portion of the etch stop layer 282 that overlie the horizontal plane including the top surface of the insulating cap layer 70 can be collaterally removed during the CMP process. The remaining portion of the deposited dielectric material filling the stepped cavity constitutes the retro-stepped dielectric material portion 65.

Optionally, drain select level isolation structures (not shown) can be formed through the insulating cap layer 70 and a subset of the sacrificial material layers 42 located at drain select levels. The drain select level isolation structures can be formed, for example, by forming drain select level isolation trenches and filling the drain select level isolation trenches with a dielectric material such as silicon oxide. Excess portions of the dielectric material can be removed from above the top surface of the insulating cap layer 70.

Referring to FIG. 19, the processing steps of FIGS. 8A, 8B, 9A-9H, and 10 can be sequentially performed to form memory openings 49 and support openings 19, to form memory opening fill structures 58 in the memory openings 49, and to form support pillar structures 20 in the support openings 19.

Referring to FIG. 20, the processing steps of FIGS. 11A and 11B can be performed to form a contact-level dielectric layer 73, to form backside trenches 79, and to form source regions 63. An anneal process can be performed to crystallize the amorphous dielectric material of the etch stop layer 282 into a polycrystalline material. The etch stop layer 282 as crystallized after the anneal process is herein referred to as a crystalline etch stop layer 284, which can be a polycrystalline dielectric etch stop layer. The anneal process can be performed at an elevated temperature, which may be in a range from 800 degrees Celsius to 1,100 degrees Celsius. The anneal process can collaterally activate the electrical dopants in the pedestal channel portions 11, the vertical semiconductor channels 60, the drain regions 63, and the source regions 61.

Referring to FIG. 21, an etchant that selectively etches the second material of the sacrificial material layers 42 with respect to the first material of the insulating layers 32 and the crystalline etch stop layer 284 can be introduced into the backside trenches 79, for example, employing a wet etch process. Backside recesses 43 are formed in volumes from which the sacrificial material layers 42 are removed. The removal of the second material of the sacrificial material layers 42 can be selective to the first material of the insulating layers 32, the material of the crystalline etch stop layer 284, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 are removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 22, the processing steps of FIGS. 13B-13D, 14A and 14B, and 15A and 15B can be performed to form optional backside blocking dielectric layers 44, electrically conductive layers 46, insulating spacers 74, and backside contact via structures 76.

Referring to FIG. 23, a photoresist layer can be applied over the contact-level dielectric layer 73, and can be lithographically patterned to form a pattern of openings therein. A first anisotropic etch process can be performed to etch through the contact-level dielectric layer 73 and the retro-stepped dielectric material portion 65. The anisotropic etch process may etch the materials of the contact-level dielectric layer 73 and the retro-stepped dielectric material portion 65 selective to the material of the etch stop layer 284.

Contact via cavities (85, 8Q) are formed through the retro-stepped dielectric material portion 65. The contact via cavities (85, 8Q) may include word-line contact via cavities 85 vertically extending through the contact-level dielectric layer 73 and the retro-stepped dielectric material portion 65 to a top surface of a respective segment of the etch stop layer 284. In additional, the contact via cavities (85, 8Q) may include peripheral contact via cavities 8Q vertically extending through the contact-level dielectric layer 73 and the retro-stepped dielectric material portion 65 to a top surface of a horizontally-extending portion of the etch stop layer 284. A respective portion of the etch stop layer 284 is physically exposed at a bottom of each of the via cavities (85, 8Q). In one embodiment, the entirety of the etch stop layer 284 comprises a polycrystalline dielectric material at this processing step.

Referring to FIG. 24, an ion implantation process can be performed to implant ions through the contact via cavities (85, 8Q) into physically exposed underlying portions of the etch stop layer 284. The ions may comprise a non-metallic element such as carbon, nitrogen, or oxygen. The implanted portions of the etch stop layer 284 that underlie the contact via cavities (85, 8Q) become amorphous, and are converted into amorphous material portions 285. In one embodiment, the ions may be implanted into portions of the backside blocking dielectric layers 44 located between each of the amorphous material portions 285 and a respective underlying electrically conductive layer 46.

Referring to FIG. 25, a second anisotropic etch process can be performed to remove the amorphous material portions 285 and portions of the backside blocking dielectric layers 44 that underlie the amorphous material portions 285. According to an aspect of the present disclosure, amorphizing the portions of the etch stop layer 284 that underlie the contact via cavities (85, 8Q) facilitates selective etching of the amorphous material portions 285 during the second anisotropic etch process compared to etching a polycrystalline material of the etch stop layer 284. The contact via cavities (85, 8Q) are vertically extended through a remaining portion of the etch stop layer 284. The remaining horizontal portions of the etch stop layer comprise the etch stop plates 182. A segment of a top surface of an electrically conductive layer 46 is physically exposed at the bottom of each of the contact via cavities (85, 8Q).

The word-line contact via cavities 85 vertically extend through the contact-level dielectric layer 73, the retro-stepped dielectric material portion 65, the etch stop plate portions 182 of the etch stop layer 284, and a backside blocking dielectric layers 44 (if present). Peripheral contact via cavities 8Q vertically extend through the contact-level dielectric layer 73 and the retro-stepped dielectric material portion 65 to a conductive node of a respective peripheral semiconductor device 700 in the peripheral region 200. Drain contact via cavities 87 can be formed through the contact-level dielectric layer 73 over the drain regions 63. The drain contact via cavities 87 may be formed through the contact-level dielectric layer 73 over the drain regions 63.

At least one conductive material, such as at least one metallic material, can be deposited in the various contact via cavities, and excess portions of the at least one conductive material can be removed from above the horizontal plane including the top surface of the contact-level dielectric layer 73. Remaining portions of the at least one conductive material comprise various contact via structures (86, 88, 8P). The contact via structures (86, 88, 8P) comprise word-line contact via structures 86 in contact with a respective one of the electrically conductive layers 46 and with the etch stop layer 284, drain contact via structures 88 in contact with a respective one of the drain regions 63, and peripheral contact via structures 8P in contact with a respective one of the peripheral semiconductor devices 700 within the peripheral region 200. In one embodiment, the etch stop layer 284 comprises a dielectric material such as polycrystalline aluminum oxide or polycrystalline silicon carbide. Thus, in this embodiment, the etch stop plates 182 also comprise the polycrystalline aluminum oxide or polycrystalline silicon carbide.

According to an aspect of the present disclosure, a three-dimensional memory device is provided, which comprises: an alternating stack of insulating layers 32 and electrically conductive layers 46 located over a substrate (9, 10), wherein the alternating stack (32, 46) comprises a staircase region 300 in which lateral extents of the electrically conductive layers 46 decrease with a vertical distance from the substrate (9, 10); memory stack structures 55 vertically extending through the alternating stack (32, 46), wherein each of the memory stack structures 55 comprises a vertical semiconductor channel 60 and a vertical stack of memory elements; etch stop plates 182 located in the staircase region 300, and overlying an end portion of a respective one of the electrically conductive layers 46, wherein the etch stop plates 182 comprise the material selected from tungsten nitride, tungsten carbide, tungsten carbonitride, aluminum oxide, or silicon carbide; and contact via structures (such as word-line contact via structures 86) located in the staircase region 300, vertically extending through a respective one of the etch stop plates 182, and contacting a respective one of the electrically conductive layers 46.

The etch stop plates 182 decrease the likelihood that the electrically conductive layers 46 are etched through by the contact via cavities 85 during the isotropic etch that forms the contact via cavities. Thus, the probability of electrically shorting multiple electrically conducive layers by a word line contact via structure 86 that extends through an overlying electrically conductive layer 46, an insulating layer 32, and an underlying electrically conductive layer 46 decreases due to the presence of the etch stop plates 182.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate, wherein the alternating stack comprises a staircase region in which lateral extents of the electrically conductive layers decrease with a vertical distance from the substrate;
   memory stack structures vertically extending through the alternating stack, wherein each of the memory stack structures comprises a vertical semiconductor channel and a vertical stack of memory elements;
   etch stop plates located in the staircase region, and overlying an end portion of a respective one of the electrically conductive layers, wherein the etch stop plates comprise tungsten carbonitride; and
   contact via structures located in the staircase region, vertically extending through a respective one of the etch stop plates, and contacting the respective one of the electrically conductive layers.

2. The three-dimensional memory device of claim 1, wherein the etch stop plates are laterally and vertically spaced apart from each other.

3. The three-dimensional memory device of claim 1, further comprising dielectric spacers located in the staircase region, wherein one of the dielectric spacers contacts a sidewall of one of the insulating layers and contacts a pair ones of the etch stop plates.

4. The three-dimension memory device of claim 3, wherein the dielectric spacer contacts a bottom surface of a first etch stop plate within the pair of etch stop plates and contacts a sidewall of a second etch stop plate within the pair of etch stop plates.

5. The three-dimensional memory device of claim 1, wherein each of the etch stop plates comprises:
   a planar bottom surface;
   a vertical sidewall adjoined to a first edge of the planar bottom surface;
   a convex surface segment adjoined to a second edge of the planar bottom surface; and
   a planar top surface adjoined to a top end of the vertical sidewall and adjoined to an upper edge of the convex surface segment.

6. The three-dimensional memory device of claim 5, wherein:
   each of the electrically conductive layers is embedded within a respective one of backside blocking dielectric layers; and the planar bottom surface of each of the etch stop plates contacts a top surface of the respective one of the backside blocking dielectric layers.

* * * * *